United States Patent
Nishida

Patent Number: 5,858,806
Date of Patent: Jan. 12, 1999

[54] METHOD OF BONDING IC COMPONENT TO FLAT PANEL DISPLAY

[75] Inventor: Kazuto Nishida, Katano, Japan

[73] Assignee: Matsushita Electric Industrial Co., Ltd., Osaka-fu, Japan

[21] Appl. No.: 620,171

[22] Filed: Mar. 22, 1996

[30] Foreign Application Priority Data

Mar. 24, 1995 [JP] Japan .................................. 7-066172

[51] Int. Cl.⁶ .................................................. H01L 21/00
[52] U.S. Cl. ............................ 438/7; 438/15; 438/118; 438/119
[58] Field of Search ................................ 438/7, 15, 118, 438/119

[56] References Cited

U.S. PATENT DOCUMENTS 4,984,887  1/1991  Yoshioka .................................. 345/87

FOREIGN PATENT DOCUMENTS 4-302444  10/1992  Japan .
5-144873   6/1993  Japan .

Primary Examiner—John Niebling
Assistant Examiner—Thomas G. Bilodeau
Attorney, Agent, or Firm—Wenderoth, Lind & Ponack

[57] ABSTRACT

A method wherein an IC component is mounted to electrodes provided in a transparent portion of a flat panel display with interposition of an anisotropic conductive adhesive or film, includes steps of detecting, when mounting the IC component onto the transparent portion of the flat panel display for temporary bonding to the adhesive or film, positional displacement amounts of first positional alignment portions in two positions of the mounted IC component relative to second positional alignment portions in two positions of the transparent portion of the flat panel display in correspondence with the first positional alignment portions by a camera from a side of the flat panel display opposite from a side on which the IC component is mounted, thereby inspecting positional alignment state of bumps of the IC component with the electrodes of the flat panel display, feeding back the positional displacement amount of the IC component with respect to the flat panel display when the positional alignment state is not acceptable, and performing positional alignment of bumps of a next IC component with the electrodes of the flat panel display while taking the fed-back positional displacement amount into account. A state of bonding of the bumps to the electrodes of the flat panel display is detected in a plurality of portions, it is decided that a parallelism of the IC component relative to the flat panel display exceeds a tolerance range when the state of bonding is not acceptable, and then a warning signal is outputted.

17 Claims, 23 Drawing Sheets

Fig.13A
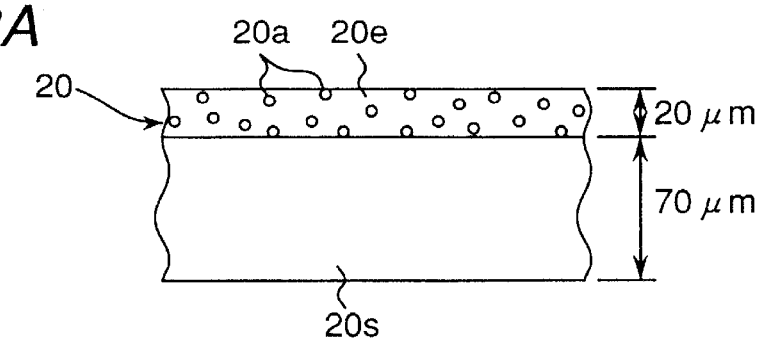
Fig.13B
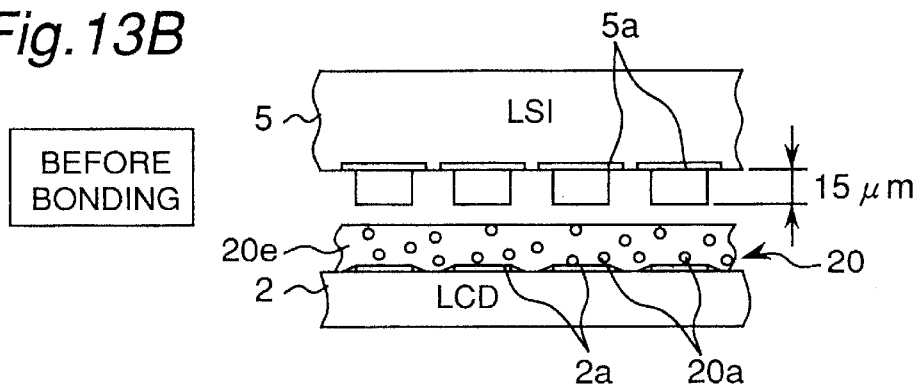
Fig.13C APPLY HEAT AND PRESSURE
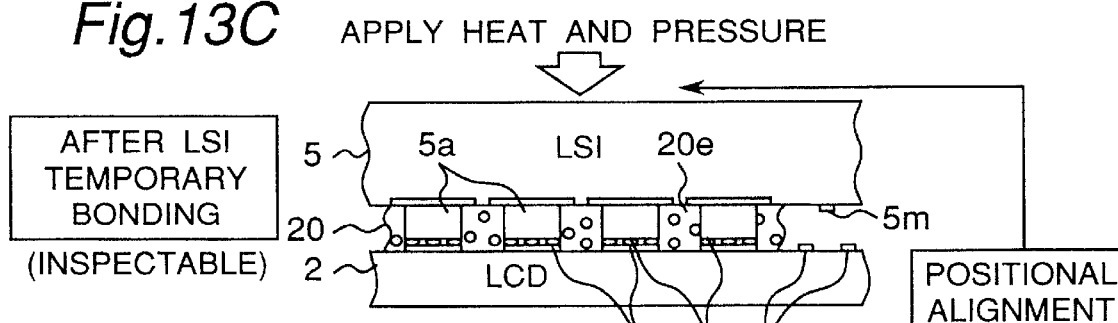
Fig.13D
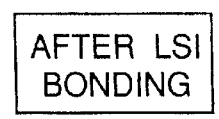
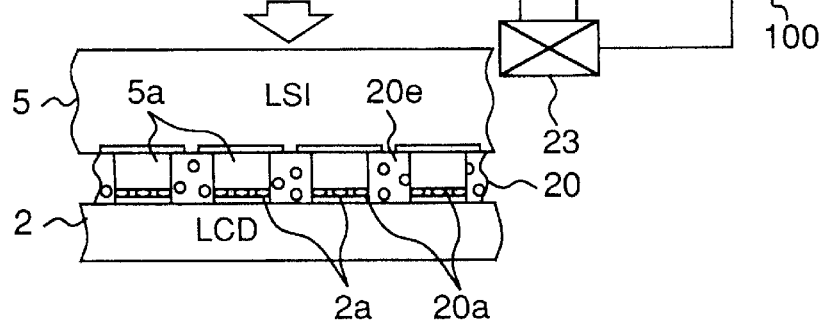

BEFORE BONDING

APPLY HEAT AND PRESSURE

AFTER LSI TEMPORARY BONDING
(INSPECTABLE)

APPLY HEAT AND PRESSURE

AFTER LSI BONDING

PARALLELISM OK   PARALLELISM NG

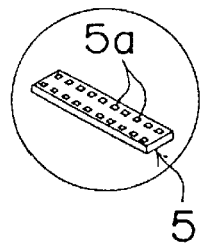
Fig. 27A2 PRIOR ART
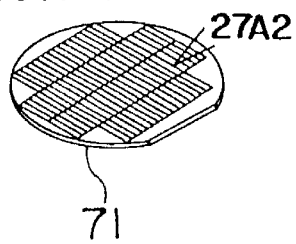
Fig. 27A1 PRIOR ART
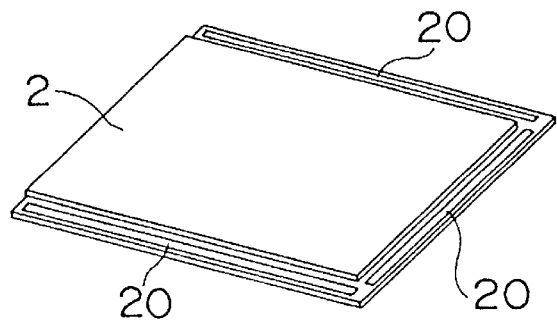
Fig. 27B PRIOR ART
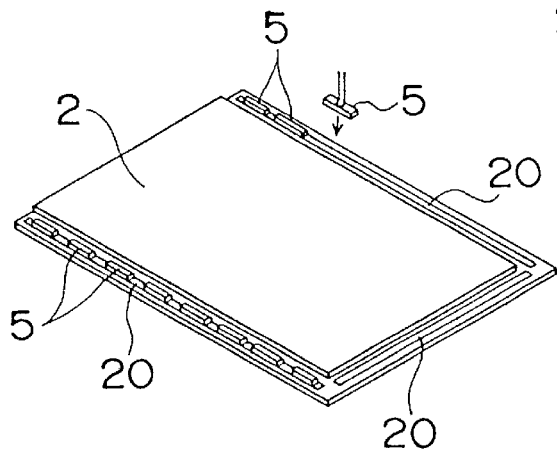
Fig. 27C PRIOR ART
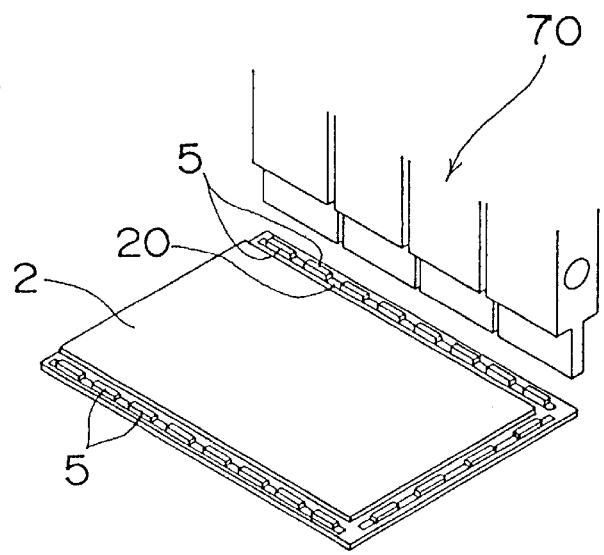
Fig. 27D PRIOR ART

METHOD OF BONDING IC COMPONENT TO FLAT PANEL DISPLAY

BACKGROUND OF THE INVENTION

The present invention relates to a method of mounting an IC component to a flat panel display such as a liquid crystal display or a plasma display by bonding the electrodes, specifically, bumps on the electrodes of the IC component to the electrodes of the flat panel display.

A prior art method for bonding an IC component to a flat panel display is shown in FIGS. 27A1 through 28.

In FIGS. 27A1 and 27A2, each IC component for driving a flat panel display is prepared by taking an IC chip (CSP: Chip Size Package) out of a wafer 71 and providing the electrodes on the rear surface thereof with plating bumps. On the other hand, in step S50 shown in FIG. 28, a liquid crystal display (LCD) panel as shown in FIG. 27B is placed in a specified position. In step S51, an anisotropic conductive adhesive or film (ACF, or anisotropic conductive sheet) 20 is attached to electrodes 2a provided on the periphery of a liquid crystal display panel 2. In step S52, each IC component 5 sucked by a component suction unit is aligned in position with the flat panel display 2, and the IC component 5 is temporarily bonded (pre-mounted under pressure) onto the anisotropic conductive adhesive or film 20 of the flat panel display 2 by means of a pressurizing tool 70. Then, in step S54, each flexible board is connected to the flat panel display 2. In step S55, the flat panel display 2 is subjected to an image electric inspection process. In this stage, it is decided whether or not the IC component 5 mounted on the flat panel display 2 can operate. If the IC component 5 is defective, the program flow proceeds to step S59 to remove the IC component 5 from the flat panel display 2 and mount another new IC component 5. When the IC component 5 is a good one, in step S56, the IC component 5 is regularly or properly bonded (mounted under pressure) to the anisotropic conductive adhesive or film 20 of the flat panel display 2 at a temperature and a pressurizing force that are higher than those in the temporary bonding process. Subsequently, in step S57, the IC component 5 and the anisotropic conductive adhesive or film 20 are coated with protection resin. In step S58, the flat panel display 2 mounted with each IC component 5 is stored in a specified position.

However, according to the above-mentioned bonding method, a lot of actual IC components have been used to be mounted onto the flat panel display for the purpose of finding an offset amount for cancelling a positional alignment error when aligning in position the IC component 5 with the flat panel display 2, and this has also resulted in the wastefulness of the IC components and requirement of much labor.

Furthermore, each IC component is mounted to the flat panel display via the anisotropic conductive adhesive or film. Therefore, even when the IC component and the flat panel display are accurately aligned in position with each other before mounting the IC component, the IC component slips with respect to the flat panel display due to the viscosity of the anisotropic conductive adhesive or film in the mounting stage, possibly causing a significant displacement of the IC component relative to the flat panel display after the IC component is mounted.

On the other hand, due to the warping of the flat panel display, a parallelism of the IC component relative to the flat panel display is possibly disordered. Furthermore, depending on the parallelism of a pressurizing tool for pressurizing the IC component against the flat panel display, the parallelism of the IC component relative to the flat panel display is possibly disordered. Therefore, the parallelism of the IC component relative to the flat panel display is required to be controlled within a specified tolerance range.

Measurement of the parallelism has been performed by measuring collapse of conductive particles in the anisotropic conductive adhesive or film or hue of bumps attached to the electrodes of the IC component by means of a microscope to measure the parallelism at a plurality of portions of the bonding portion of the IC component and the flat panel display. However, different measurement results may be produced depending on different microscopes, and if the positional relationship between the microscope and the bonding portion of the IC component and the flat panel display varies at each of the portions, different optical reflectance values result. This also causes an error in the measurement of the parallelism, meaning that the measurement of the parallelism has been difficult. Furthermore, when operators evaluate the parallelism, the operators become sensuous and produce different evaluation results due to differences between individuals, meaning that the evaluation lacks objectivity and can not be quantified.

SUMMARY OF THE INVENTION

An object of the present invention is to provide a method of bonding each IC component to a flat panel display capable of assuring mounting of the IC component onto the flat panel display with higher reliability and high accuracy.

In accomplishing these and other aspects, according to a first aspect of the present invention, there is provided a method of mounting an IC component to a flat panel display, wherein an IC component is mounted to electrodes provided in a transparent portion of a flat panel display with interposition of an anisotropic conductive adhesive or film, the method comprising steps of:
detecting, when mounting the IC component onto the transparent portion of the flat panel display for temporary bonding to the anisotropic conductive adhesive or film, positional displacement amounts of first positional alignment portions provided in at least two positions of the mounted IC component relative to second positional alignment portions provided in at least two positions of the transparent portion of the flat panel display in correspondence with the first positional alignment portions by a camera from a side of the flat panel display opposite from a side on which the IC component is mounted, thereby inspecting positional alignment state of bumps of the IC component with the electrodes of the flat panel display;
feeding back the positional displacement amount of the IC component with respect to the flat panel display when the positional alignment state is not acceptable; and
performing positional alignment of bumps of a next IC component with the electrodes of the flat panel display while taking the fed-back positional displacement amount into account.

According to a second aspect of the present invention, there is provided the method as defined in the first aspect, wherein the IC component has a rectangular surface shape, and the first positional alignment portions of the IC component are arranged in a vicinity of a corner of the rectangular surface shape and in a vicinity of another corner located diagonally with respect to the above-mentioned corner, while the second positional alignment portions of the flat panel display are arranged in correspondence with the first positional alignment portions.

According to a third aspect of the present invention, there is provided the method as defined in the first aspect, further comprising steps of:

capturing an image of the bumps of the mounted IC component by the camera from the side of the flat panel display opposite from the side on which the IC component is mounted;

detecting a state of bonding of the bumps of the IC component to the electrodes of the flat panel display in a plurality of portions;

deciding that a parallelism of the IC component relative to the flat panel display exceeds a tolerance range when the state of bonding is not acceptable, and then outputting a warning signal.

According to a fourth aspect of the present invention, there is provided a method of mounting an IC component to a flat panel display, wherein an IC component is mounted to electrodes provided in a transparent portion of a flat panel display with interposition of an anisotropic conductive adhesive or film including conductive particles, the method comprising steps of:

capturing, when mounting the IC component onto the transparent portion of the flat panel display for temporary bonding to the anisotropic conductive adhesive or film, an image of bumps on the electrodes of the mounted IC component by the camera from the side of the flat panel display opposite from the side on which the IC component is mounted;

detecting a state of bonding of the bumps of the IC component to the electrodes of the flat panel display in a plurality of portions;

deciding that a parallelism of the IC component relative to the flat panel display exceeds a tolerance range when the state of bonding is not acceptable, and then outputting a warning signal.

According to a fifth aspect of the present invention, there is provided the method as defined in the third or fourth aspect, wherein the state of bonding is expressed by a state of collapse of conductive particles included in the anisotropic conductive adhesive or film interposed between the bumps of the IC component and the electrodes of the flat panel display.

According to a sixth aspect of the present invention, there is provided the method as defined in the fifth aspect, wherein in the step of capturing the image, an image of a bonding portion of the bumps of the IC component and the electrodes of the flat panel display is captured by the camera, and in the step of detecting the state of the collapse of the conductive particles as the state of bonding, this step including steps of:

extracting from the captured image a bump portion including at least one of the bumps of the IC component and a vicinity of the bump;

extracting areas each having a luminance higher than a threshold value out of each of the extracted bump portion;

obtaining a sum total of the extracted areas; and deciding that the state of the collapse of the conductive particles is permissible when a value of the sum total of the areas is greater than a specified value, and deciding that the state of collapse of the conductive particles is not permissible when a value of the sum total of the areas is not greater than the specified value and then outputting a warning signal.

According to a seventh aspect of the present invention, there is provided the method as defined in the third or fourth aspect, wherein in the step of capturing the image, an image of a bonding portion of the bumps of the IC component and the electrodes of the flat panel display is captured by the camera, and in the step of detecting the state of bonding, this step including steps of:

extracting from the captured image a plurality of bump portions including the bumps of the IC component and a vicinity of the bumps of the IC component;

obtaining a total reflectance at each of the plurality of extracted bump portions;

obtaining a difference between the obtained total reflectance values;

deciding that the parallelism of the IC component relative to the flat panel display is out of the tolerance range when the difference is greater than a specified value, and then outputting a warning signal.

According to an eighth aspect of the present invention, there is provided the method as defined in the third or fourth aspect, wherein in the step of capturing the image, an image of a bonding portion of the bumps of the IC component and the electrodes of the flat panel display is captured by the camera, and in the step of detecting the state of bonding, this step including steps of:

extracting from the captured image a plurality of bump portions including the bumps of the IC component and a vicinity of the bumps of the IC component;

extracting of a specified identical color in each of the plurality of extracted bump portions;

obtaining a sum total in intensity of luminance signals of the color at each of the extracted bump portions;

obtaining a difference between the sum totals in intensity of the luminance signals at the extracted bump portions;

deciding that the parallelism of the IC component relative to the flat panel display is out of the tolerance range when the difference between the sum totals in intensity of the luminance signals is greater than a specified value, and then outputting a warning signal.

According to a ninth aspect of the present invention, there is provided the method as defined in any one of the third through eighth aspects, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

According to the first through third aspects, the positional displacement information obtained when the IC component is temporarily bonded to the flat panel display can be utilized when positional alignment of a next IC component is performed.

According to the first through third aspects, positional alignment of bumps of a next IC component with the electrodes of the flat panel display can be performed while utilizing the positional displacement information obtained when the IC component is temporarily bonded to the flat panel display. Therefore, when the positional alignment of the IC component with the flat panel display is performed, an offset amount for removing positional displacement amount can be found, and thus it is unnecessary to use a lot of actual IC components to be mounted onto the flat panel display for the purpose of finding an offset amount for cancelling a positional alignment error and thus it can prevent the wastefulness of the IC components and requirement of much labor.

According to the third through ninth aspects, by inspecting whether or not the state of collapse of the conductive particles in the anisotropic conductive adhesive or film, the reflectance of the bumps, or the difference between the inspected portions at each of which the intensity of the luminance signal of the specified color is inspected is within the tolerance range, it is decided whether or not the parallelism is within the tolerance range. Therefore, the parallelism inspection can be easily and surely performed. Thus, it can effectively prevent different measurement results from being produced due to different measuring devices or operators.

Therefore, a method of bonding each IC component to a flat panel display can assure mounting of the IC component onto the flat panel display with higher reliability and high accuracy.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 13A, 13B, 13C, and 13D are explanatory views of states of bonding in the bonding operation shown in FIG. 12;

FIGS. 27A1, 27A2, 27B, 27C, and 27D are perspective views showing a prior art operation of bonding an IC component to a flat panel display.

DETAILED DESCRIPTION OF TEE PREFERRED EMBODIMENTS

Figure 1:
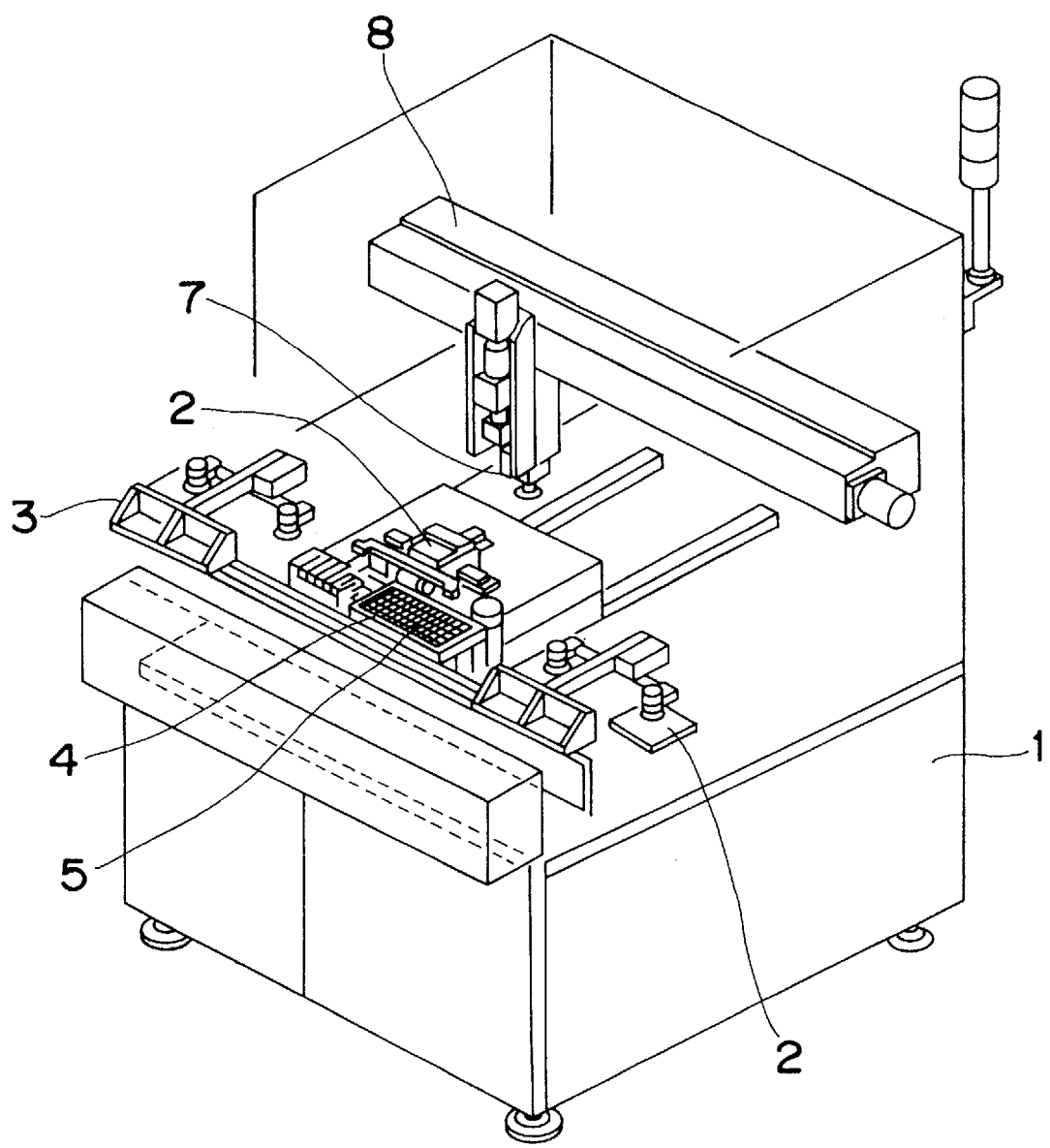
FIG. 1 is a perspective view schematically showing the total construction of an IC chip mounting device.

Before the description of the present invention proceeds, it is to be noted that like parts are designated by like reference numerals throughout the accompanying drawings.

Methods of bonding IC components onto flat panel displays of embodiments of the present invention will be described below with reference to FIGS. 1 through 26.

FIG. 1 is a perspective view schematically showing the total construction of an IC chip mounting device for use in a first embodiment of the present invention. Referring to FIG. 1, a transporting device 3 for transporting a flat panel display 2 and positioning the same in a specified position and an IC supplying means 4 for supplying IC components 5 are arranged upwardly at the front of a body 1 of the mounting device.

Above the transporting device 3 for positioning and transporting the flat panel display 2 is arranged an X-Y robot 8 for moving a pressurizing head 7 which pressurizes an IC components.

Figure 2:
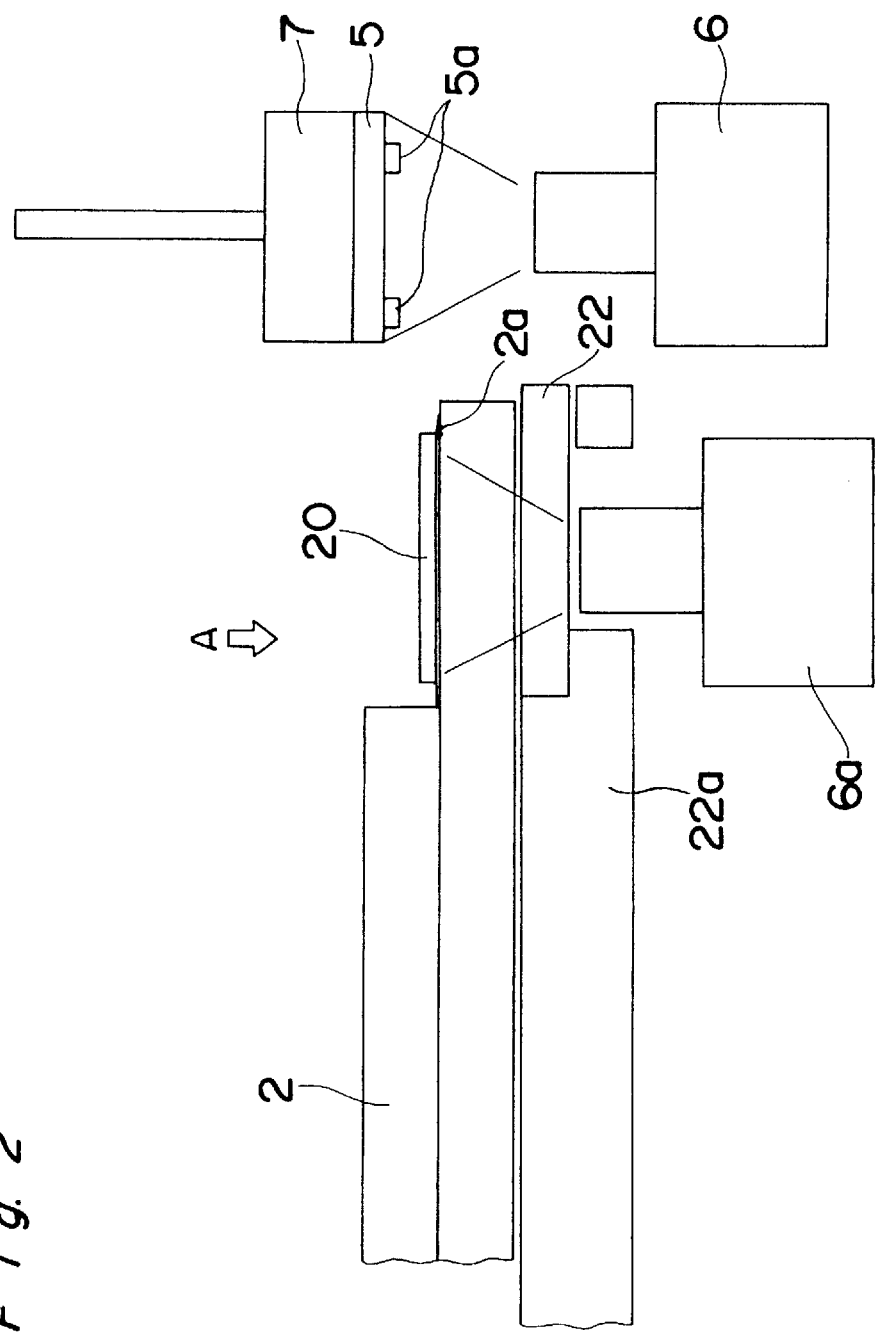
FIG. 2 is a longitudinal sectional view showing a state of the device just before an IC is mounted according to a first embodiment of the present invention.
Figure 3:
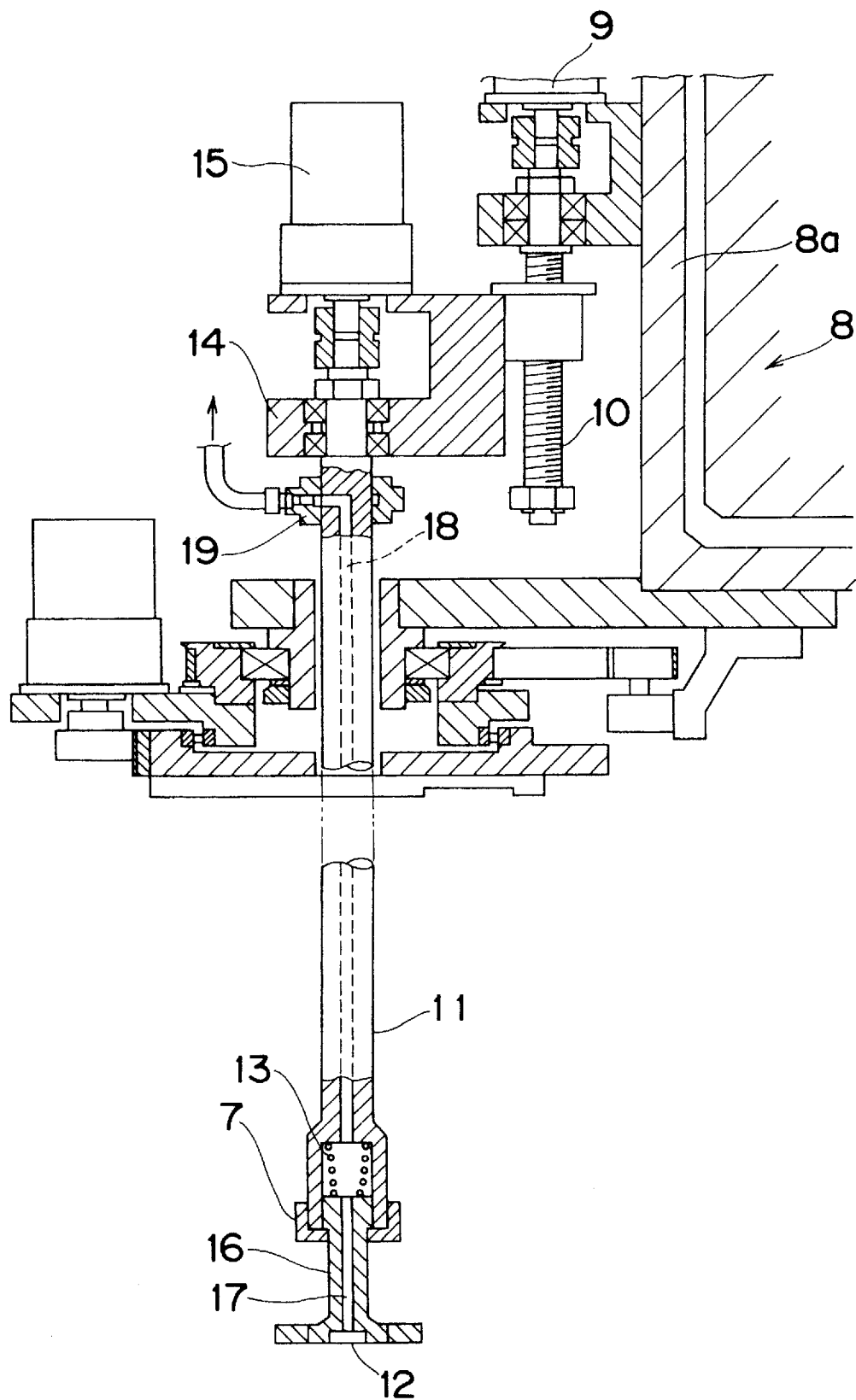
FIG. 3 is a longitudinal sectional view of a mounting head of the device.

At the pressurizing head 7, as shown in FIG. 3, there are protrudingly provided an elevating motor 9 provided for a movable portion 8a of the X-Y robot 8 and an elevating shaft 11 which is moved up and down by a feed screw mechanism 10. At the lower end of the elevating shaft 11 is mounted a suction nozzle 12 which can vertically advance and retreat as urged downward by a spring 13. A mounting shaft 16 is rotatably mounted on an elevating block 14 so as to rotate around the axis of the shaft 16 and so as to be allowed to be positioned in an arbitrary rotational position by a rotating position deciding motor 15. Furthermore, the elevating shaft 11 is formed with a suction path 18 which is communicated with a suction hole 17 of the pressurizing head 7 and connected to a suction source (not shown) via a swivel fitting 19 provided at an upper portion of the mounting shaft 16. An air cylinder may be used instead of the elevating motor 9 and the feed screw mechanism 10 for moving up and down the pressurizing head 7. A sensor 6 for sensing the temperature of the IC component 5 is arranged inside the body 1 as faced toward the IC component 5 as shown in FIG. 2.

Figure 4:
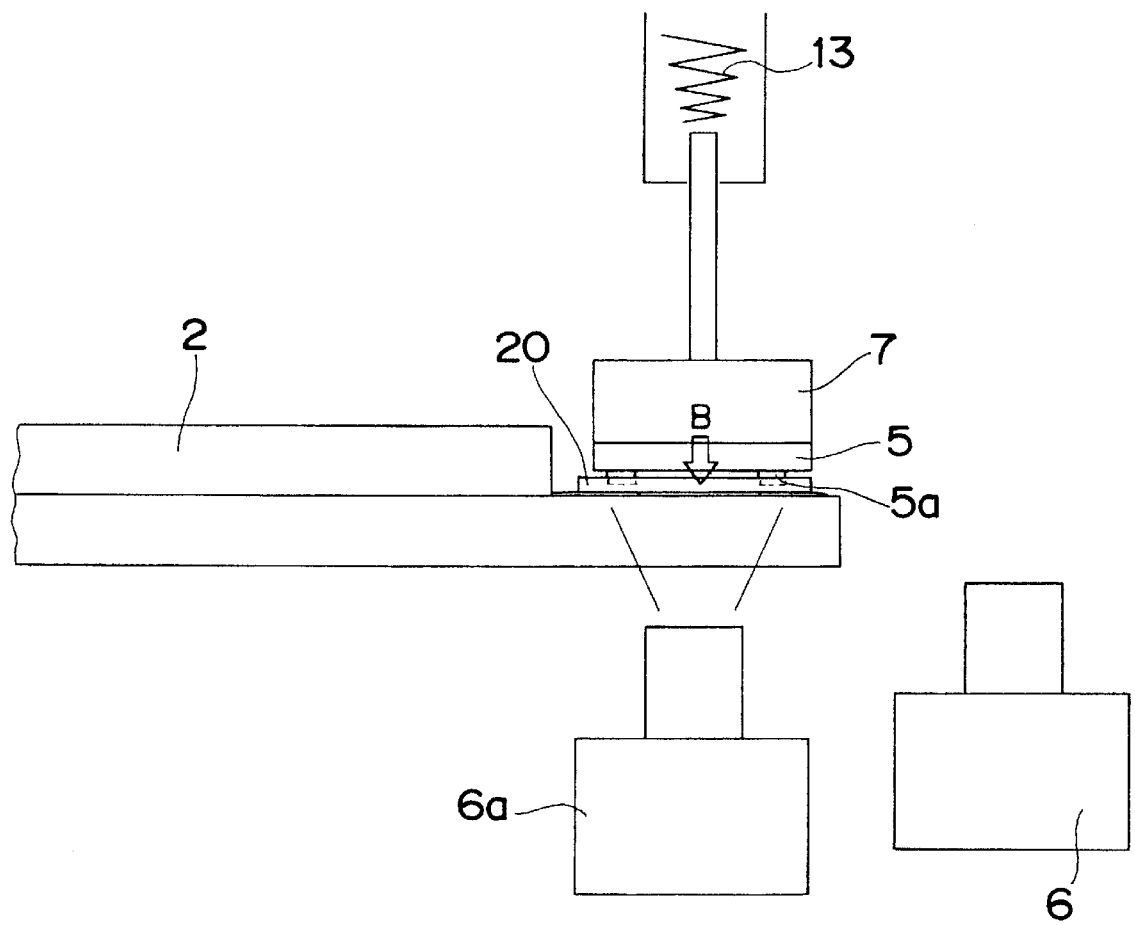
FIG. 4 is a longitudinal sectional view showing a state where an IC component is pressurized against a flat panel display in the first embodiment of the present invention.
Figure 5:
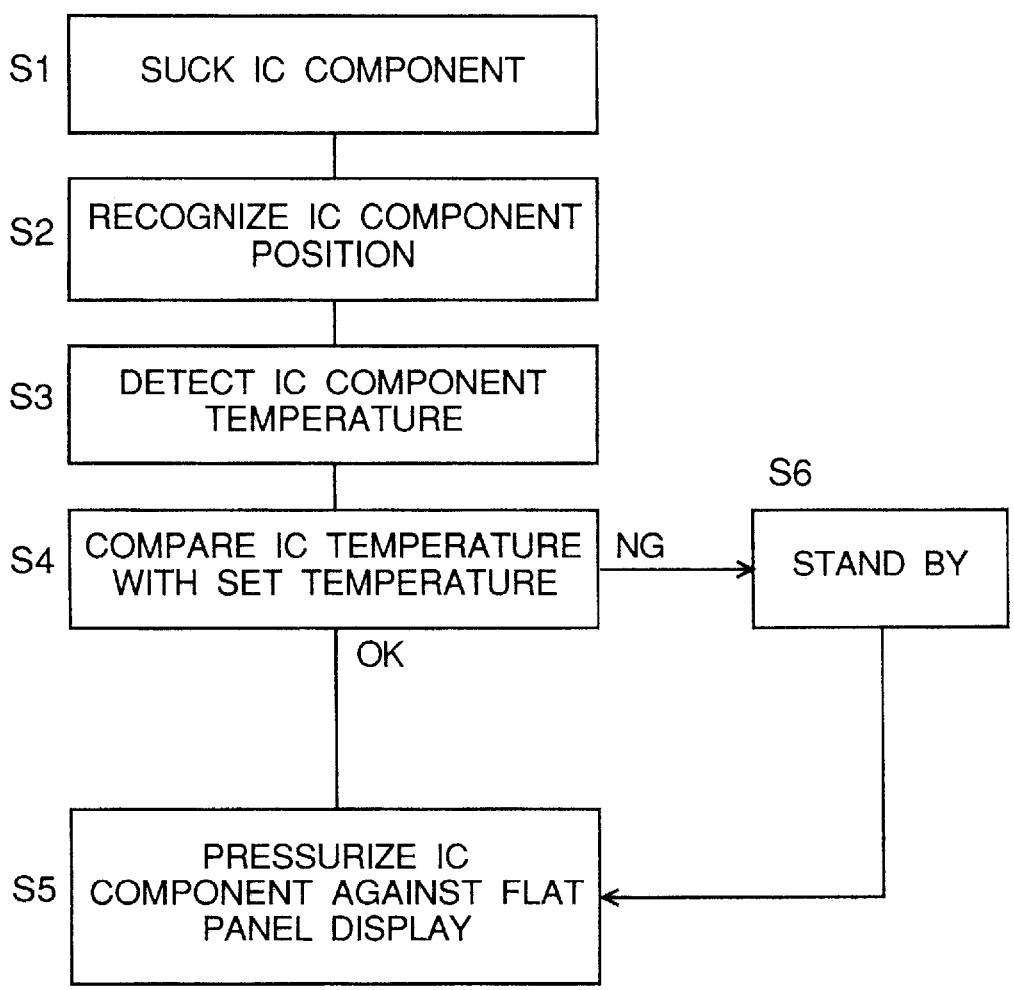
FIG. 5 is a flowchart showing an algorithm for mounting the IC component onto the flat panel display ii the first embodiment of the present invention.

Operation of mounting an IC will be described with reference to FIGS. 1 through 5. FIG. 5 shows a mounting algorithm of the method of bonding the IC components 5.

First, the IC component 5 is held by suction to the suction nozzle 12 of the pressurizing head 7 from the IC supply means 4 (step Si in FIG. 5), while the flat panel display 2 is transported by the transporting device 3. The IC component 5 is recognized by a camera and then is positioned in a specified position (step S2 in FIG. 5). When the positioning of the flat panel display 2 is completed, the pressurizing head 7 that is sucking the IC component 5 moves up, and then the X-Y robot 8 is driven to move the pressurizing head 7 to a position above the sensor 6, where the temperature of the IC component 5 is detected (step S3 in FIG. 5).

Then, the pressurizing head 7 moves toward a specified bonding position of the flat panel display 2 and positioned above the electrodes 2a of the flat panel display 2.

Then, the elevating block 14 is driven downward by the elevating motor 9, and the pressurizing head 7 moves down via the elevating shaft 11 in a direction as indicated by an arrow A as shown in FIG. 2 to pressurize the IC component 5 against the flat panel display 2. Then, the suction nozzle 12 moves down to a position where it retreats by a specified amount against the urging force of the spring 13 and stops there. It is to be noted that, when no spring is provided, the IC component 5 is pressurized directly by the pressure of the cylinder. Thus, as shown in FIG. 4, the IC component 5 is pressurized by the urging force of the spring 13 in a direction as indicated by an arrow B in the position where it is mounted and is fixed there. By this pressurization, the IC component 5 is temporarily bonded (pre-mounted under pressure), however, a specified temperature and a specified pressure are required when performing the regular or proper bonding (mounting under pressure). The temperature of the IC component 5 is preliminarily sensed by the sensor 6, and therefore, after the IC component 5 is stood by until the temperature of the IC component 5 reaches a set value (steps S4 and S6 in FIG. 5), the IC component 5 is mounted on the flat panel display 2 (step S5 in FIG. 5). Therefore, no unconnected portion is left, thereby allowing highly reliable bonding to be achieved. Furthermore, when the temperature of the IC component 5 is not risen to a specified temperature, the bonding process is performed after an interval of stand-by for the achievement of the set or specified temperature (steps S5, S6 in FIG. 5). By this operation, IC components 5 can be bonded with high reliability even when they are bonded in a short time cycle.

The method of bonding the IC component to the flat panel display of the first embodiment comprises the sensor for sensing the temperature of the IC component. The sensor senses that the temperature of the IC component has risen to the specified temperature, thereby obviating the need of calculating a condition for measuring the IC component temperature. Furthermore, there is provided the deciding process for deciding whether or not the temperature has risen to the specified temperature. Therefore, by providing a timer for making the IC component pressurization process stand by when in the deciding process a decision signal for stand-by is outputted, the possible defective pressurized bonding of the IC component can be prevented and an improved reliability is achieved.

Figure 6:
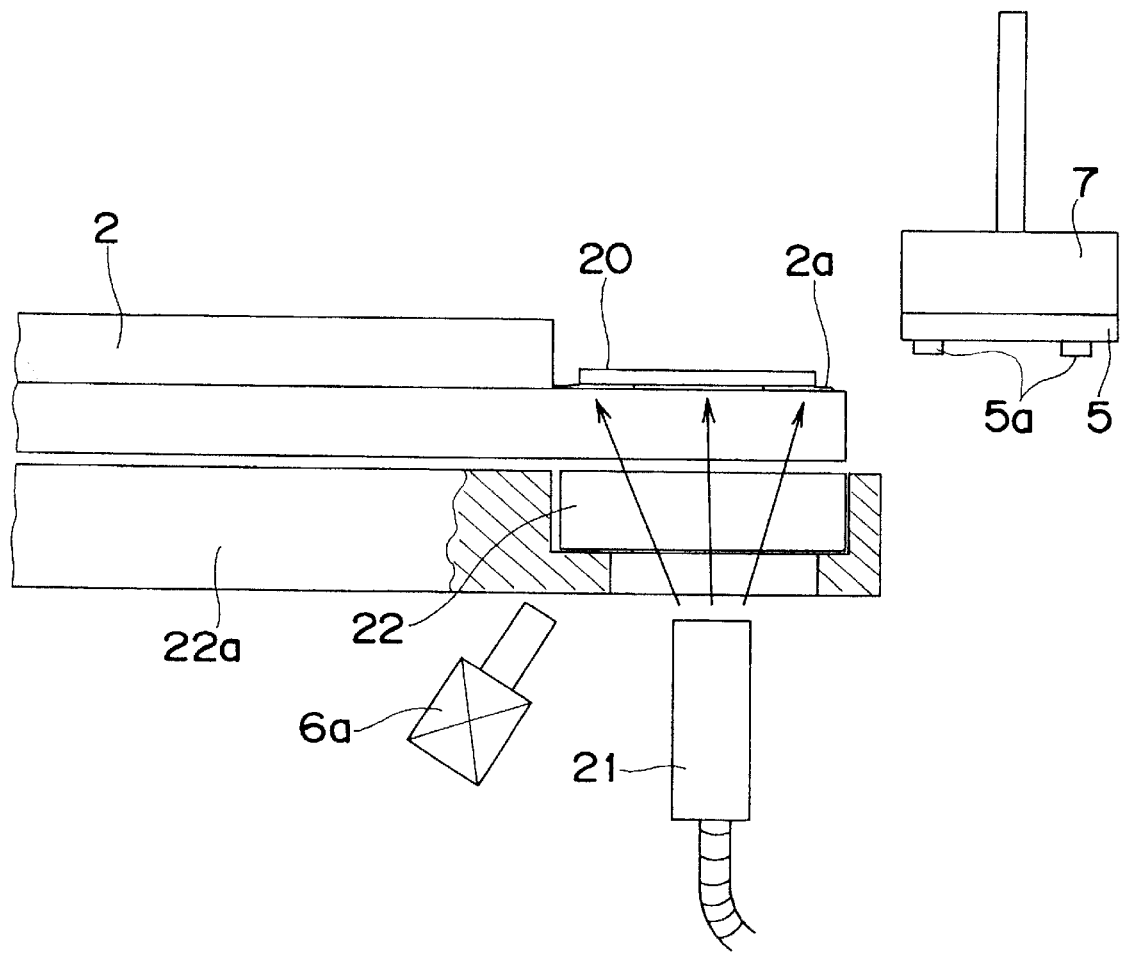
FIG. 6 is a longitudinal sectional view showing a state of the device just before an IC is mounted according to a second embodiment of the present invention.

Next, a second embodiment which uses an anisotropic conductive adhesive or film (ACF) for the bonding of an IC component will be described with reference to FIG. 6.

First, an infrared ray is irradiated from an infrared ray emitting unit 21 toward the pressurizing head 7 which is sucking the IC component 5, where the IC component 5 is firstly heated and then positioned on the electrodes 2a of the flat panel display 2 to be bonded to the flat panel display 2 via the ACF 20. In the second embodiment, the IC component 5 is heated by the infrared ray emitting unit 21, and therefore, the pressurizing head 7 can keep a relatively low temperature, so that the parallelism of the pressurizing head 7 can be easily kept, thereby allowing a highly reliable bonding to be achieved. Furthermore, it is possible to perform the pressurized bonding while heating the anisotropic conductive adhesive or film 20 by an infrared ray. In such a case, a stage 22 is implemented by crystal, glass or the like which can transmit the infrared ray.

Further, by providing a temperature sensor 6a and performing bonding while detecting the temperature of the IC component S and the anisotropic conductive adhesive or film 20, the bonding can be achieved with higher reliability.

According to the second embodiment, by heating the IC component and the anisotropic conductive adhesive or film by an infrared ray, rise of temperature can be achieved in a short time, and an improved productivity is achieved.

Next, a third embodiment in which a sensing unit is provided on a side of the flat panel display oppositely from the surface on which the IC component is to be mounted will be described with reference to FIGS. 7A and 7B.

Figure 7A:
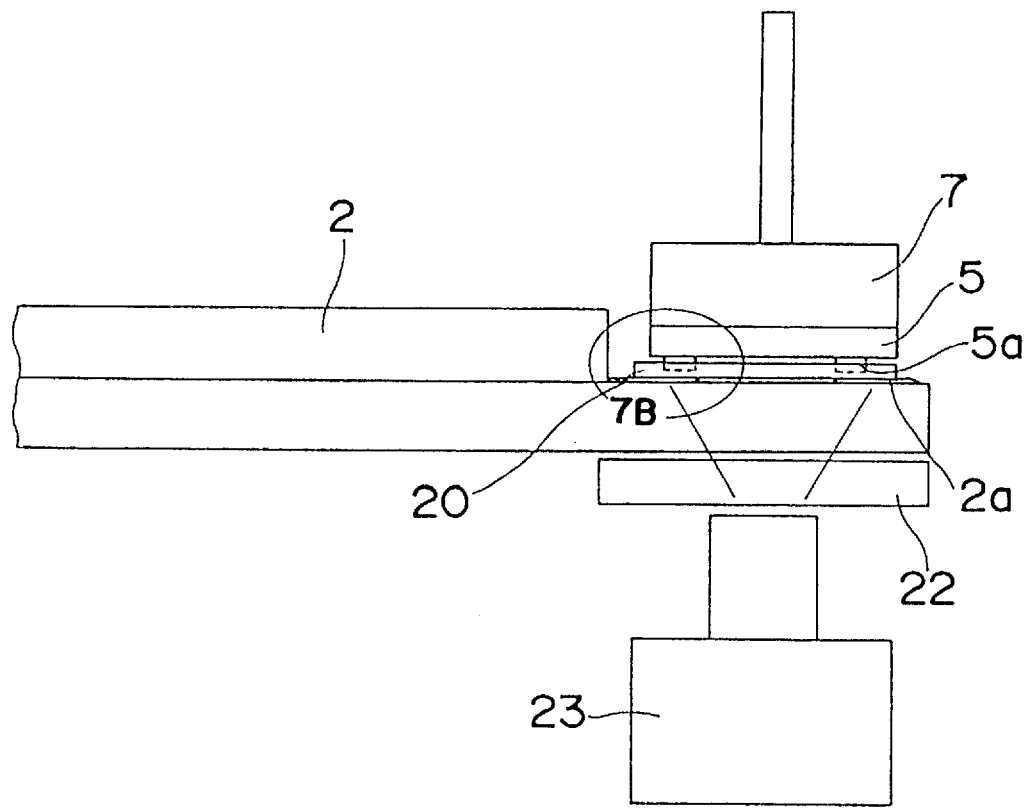
FIGS. 7A and 7B are respectively a longitudinal sectional view and an enlarged portion thereof, showing a state where an IC is pressurized according to a third embodiment of the present invention.
Figure 7B:
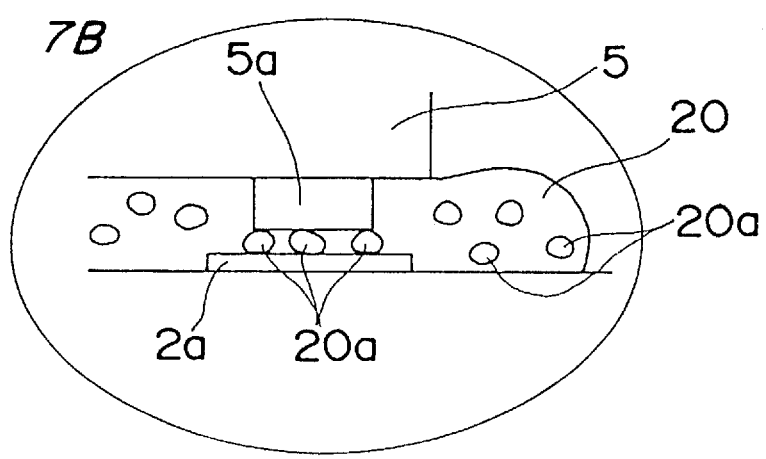

Referring to FIGS. 7A and 7B, the pressurizing head 7 sucks an IC component 5 and then pressurizes the same against the flat panel display 2. In the present case, a sensing unit 23 comprised of a camera, an infrared ray sensor, or the like is provided on a side of the flat panel display 2 oppositely from the surface on which the IC component 5 is to be mounted. By this sensing unit 23, a state of collapse of conductive particles 20a in the anisotropic conductive adhesive or film 20 between bumps 5a of the IC component 5 and the electrodes 2a of the flat panel display 2, discoloration of the anisotropic conductive adhesive or film 20, a misalignment (positional displacement) of the bumps 5a of the IC component 5 with respect to the electrodes 2a of the flat panel display 2, and/or the like are inspected. Each of the conductive particles 20a is composed of an Au—Ni—plated plastic particle. By this inspection, a more sure pressurized bonding can be achieved, so that the possible defective conduction can be prevented. This inspection can of course produce the same effect after the inspection. Furthermore, the inspection can be of course achieved visually by an inspector. In the third embodiment, since the bumps 5a of the IC component 5 and the electrodes 2a of the flat panel display 2 are inspected by the camera serving as the sensing unit 23 on the side of the flat panel display 2 oppositely from the surface on which the IC component 5 is to be mounted, it is preferable that the portion where the electrodes 2a of the flat panel display 2 are positioned is transparent and the stage 22 is also transparent.

When an infrared ray sensor is used in the sensing unit 23, the surface of the heated IC component 5 can be subjected to detection of the IC component bump position through the anisotropic conductive film 20 from below the flat panel display 2 by taking advantage of a difference in infrared ray emissivity between the materials of Al used for wiring, the Si substrate, and Au used for bumps 5a.

By performing an inspection for positional alignment of the electrodes 2a of the flat panel display 2 with the bumps 5a of the IC component 5 just before pressurizing the IC component 5, it can effectively prevent from causing destruction of the IC component 5 due to poor alignment or defective pressurized bonding which may be caused after pressurizing of the IC component 5. Furthermore, it is required to perform a repairing process for removing and re-attaching the ACF 20 and re-bonding the IC component 5 when the inspection for positional alignment is performed after pressurizing of the IC component 5 against the flat panel display 2 and it is decided that the IC component 5 is defective. However, when the inspection for positional alignment is performed before pressurizing of the IC component 5 against the flat panel display 2, even if it is decided that the IC component 5 is defective, it is unnecessary to perform such a repairing process.

Furthermore, such defective phenomena is fed back as the collapse of the conductive particles 20a of the anisotropic conductive adhesive or film 20, the discoloration of the anisotropic conductive adhesive or film 20 and the misalignment of the bumps 5a of the IC component 5 with respect to the electrodes 2a of the flat panel display 2, and then, proper adjustment such as increasing or decreasing the pressurizing force or performing alignment correction of each IC component 5 can be performed to achieve a more highly reliable bonding.

Furthermore, when the inspection process and the bonding process are separately provided, the pressurizing force of the pressurized bonding process prior to the inspection process can be controlled to be fed back from the inspection process to adjust the pressurization.

According to the third embodiment, by sensing the degree of collapse of the conductive particles and/or the degree of deformation of the anisotropic conductive adhesive or film coated or attached onto the flat panel display by means of a camera or sensor, and performing an inspection for comparing the degrees of collapse and deformation with predetermined degrees of collapse and deformation, the reliability of the bonding is improved. Moreover, by performing the inspection in the deciding process before completing the pressurized bonding process, the removal of the IC component 5 which is required for correcting the positional displacement can be easily performed.

Furthermore, by effecting a feedback control on the IC component pressurizing process by a decision signal from the deciding process, there is no need to calculate a condition for the pressurization, and this improves the productivity, allowing highly reliable bonding to be achieved.

Furthermore, when the mounting process, the pressurizing process, and the inspection process for the mounting of each IC component to a flat panel display are separately provided, by transmitting the signal from the deciding process to each process, the possible defective production can be prevented to improve the reliability of the product.

Figure 8:
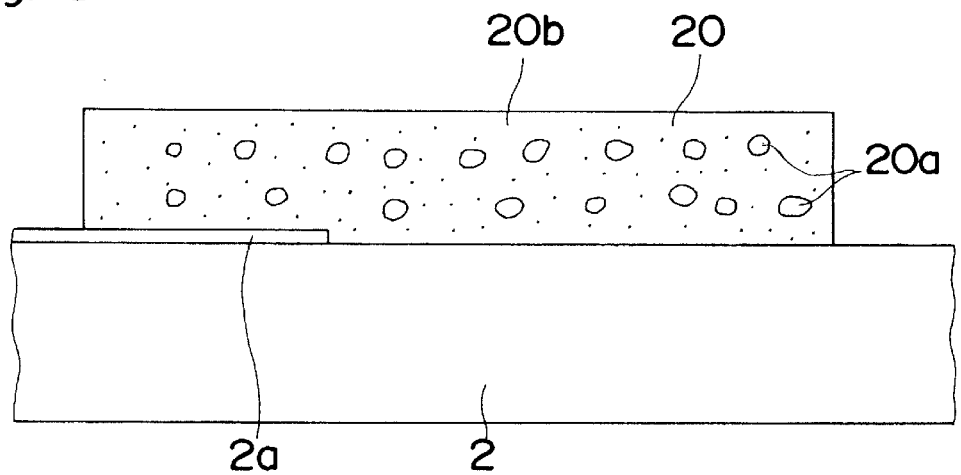
FIG. 8 is a longitudinal sectional view showing a state of an anisotropic conductive film attached to a flat panel display according to a fourth embodiment of the present invention.

Next, a fourth embodiment as shown in FIG. 8 is characterized in that, when an IC component 5 is mounted to a flat panel display 2 via an anisotropic conductive adhesive or film 20, a thermosensitive material 20b such as a thermopaint which changes its color depending on the temperature and has a diameter smaller than that of each conductive particle 20a is dispersed in the anisotropic conductive adhesive or film 20. With this arrangement, the heated portion of the anisotropic conductive adhesive or film is discolored after the bonding process, so that the fact that it has been heated can be easily decided and an automatic inspection can be easily performed. For the thermosensitive material 20b, an ammonia complex salt, epoxy liquid crystal or the like is used.

According to the fourth embodiment, when the anisotropic conductive adhesive or film is interposed between an IC component and a flat panel display in mounting the IC component to the flat panel display, by dispersing a material which changes its hue or color depending on the temperature thereof in the adhesive of the anisotropic conductive adhesive or film, it is easy to decide whether or not the temperature of the anisotropic conductive adhesive or film has risen to a specified temperature visually and/or by means of a camera or sensor, and this improves the productivity and reliability.

Figure 9:
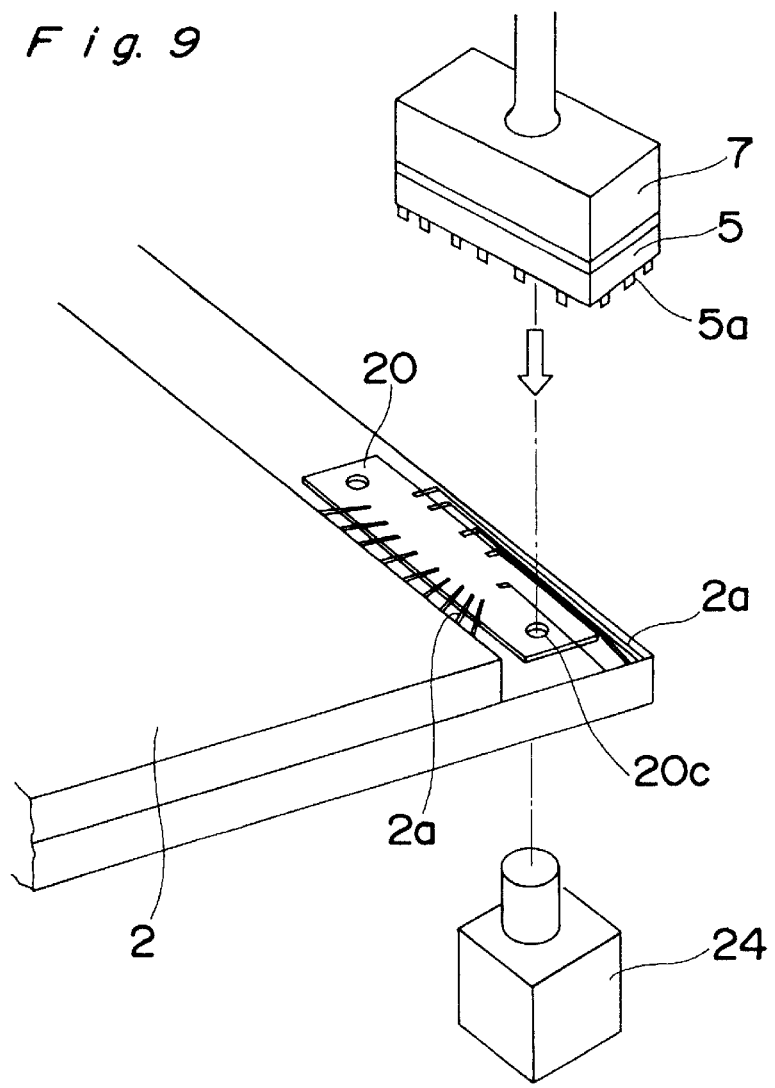
FIG. 9 is a perspective view of a state just before an IC component is bonded onto a flat panel display according to a fifth embodiment of the present invention.

Next, a fifth embodiment as shown in FIG. 9 has a construction as follows. When mounting an IC component 5 to a flat panel display 2, a cutaway portion 20c is provided at an anisotropic conductive adhesive or film 20 to be attached onto the electrodes 2a of the flat panel display 2 so that a part of the IC component 5 can be recognized by a recognizing unit such as a camera or sensor 24 arranged on the opposite side of the electrodes 2a of the flat panel display 2, thereby allowing the bumps 5a of the IC component 5 and the electrodes 2a of the flat panel display 2 to be aligned with each other with high accuracy.

Furthermore, instead of providing the cutaway portion 20c, it is acceptable to attach an anisotropic conductive adhesive or film 20 onto the flat panel display 2 and thereafter remove a part of the adhesive or film by an adhesive or film removing process.

According to the fifth embodiment, by preparatorily providing a cutaway portion at the anisotropic conductive adhesive or film to be interposed between the IC component and the flat panel display, arranging a camera or sensor on the flat panel display surface opposite from the bonding surface so that a part of the IC component can be seen from the flat panel display surface opposite from the surface on which the anisotropic conductive adhesive or film is attached thereby recognize the position of the IC component. With this arrangement, an improved accuracy is assured in positional alignment of the electrodes of the IC component with the electrodes of the flat panel display, and the quality and the reliability are improved.

Furthermore, by removing a part of the anisotropic conductive adhesive or film after the anisotropic conductive adhesive or film is coated or attached onto the flat panel display, recognizing the position of the IC component by means of the camera or sensor provided on the opposite side of the bonding surface of the flat panel display, and aligning it in position with the electrode surface of the flat panel display, the IC component is mounted onto the flat panel display. With this arrangement, an improved positioning accuracy is achieved, and the quality and reliability are improved.

Next, the third embodiment will be described in detail with reference to FIGS. 10 through 26.

Figure 10:
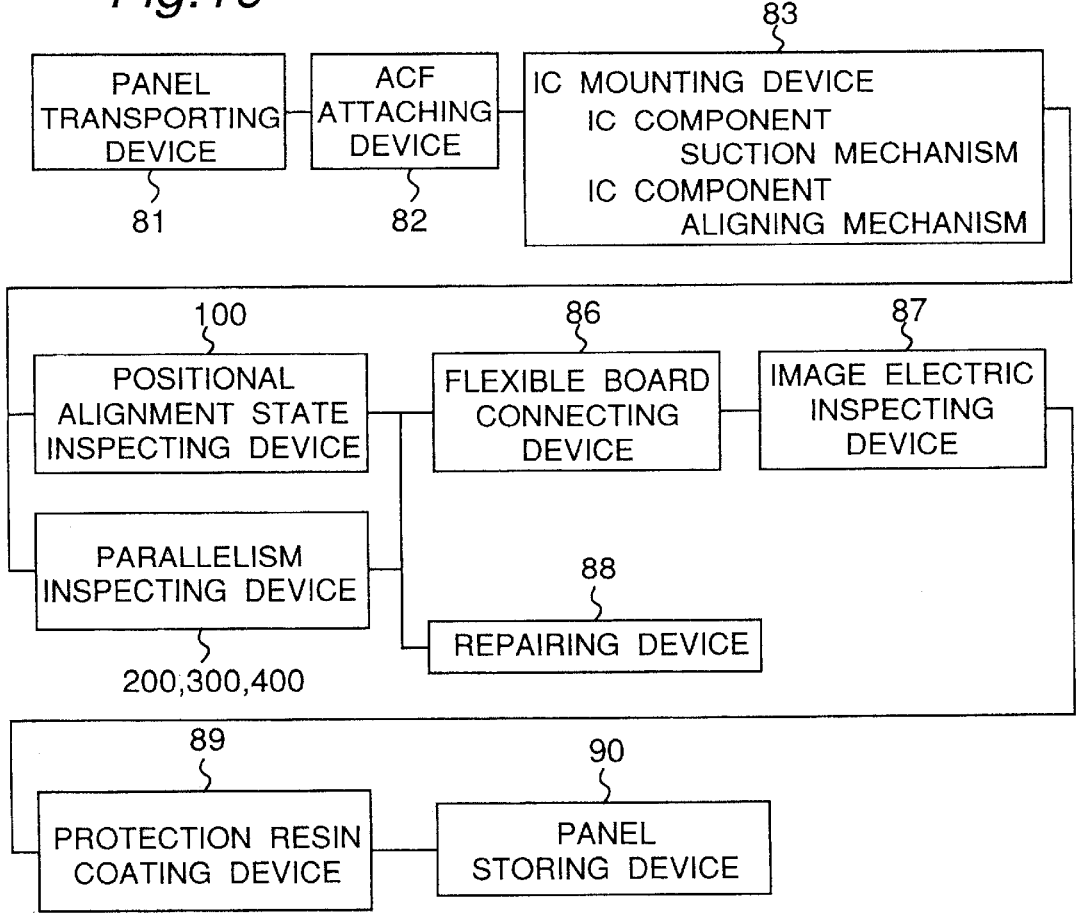
FIG. 10 is a block diagram of an apparatus to be used for the method of bonding the IC component to the flat panel display according to the third embodiment.

First, an apparatus for use in the method of bonding the IC component to the flat panel display according to the third embodiment is shown in FIG. 10. The apparatus comprises a panel transporting device 81, an ACF attaching device 82, an IC mounting device 83 having an IC component suction mechanism and an IC component aligning mechanism, a positional alignment state inspecting device 100, a parallelism inspecting device 200, 300, or 400, a flexible board connecting device 86, an image electric inspecting device 87, a repairing device 88, a protection resin coating device 89, and a panel storing device 90.

Next, the operation of bonding the IC component 5 to the flat panel display 2 in the third embodiment will be described in detail.

Figure 11:
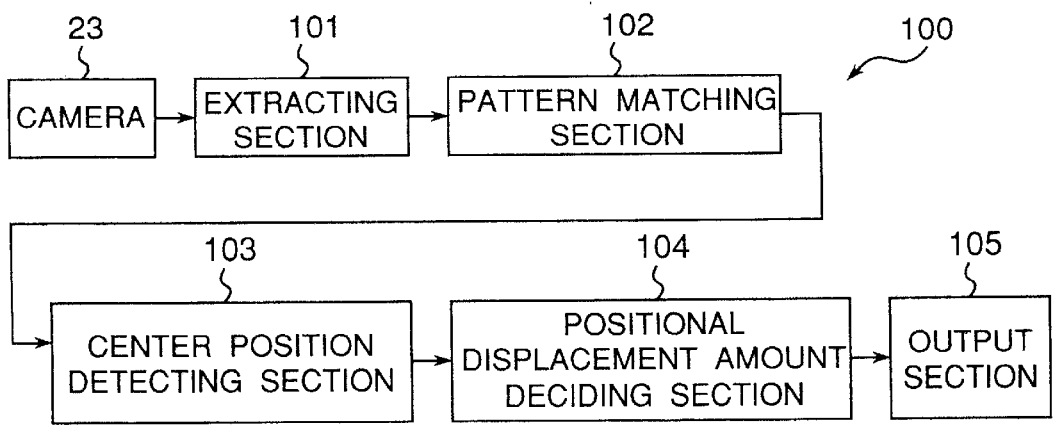
FIG. 11 is a block diagram of a positional alignment state inspecting apparatus of the third embodiment.
Figure 12:
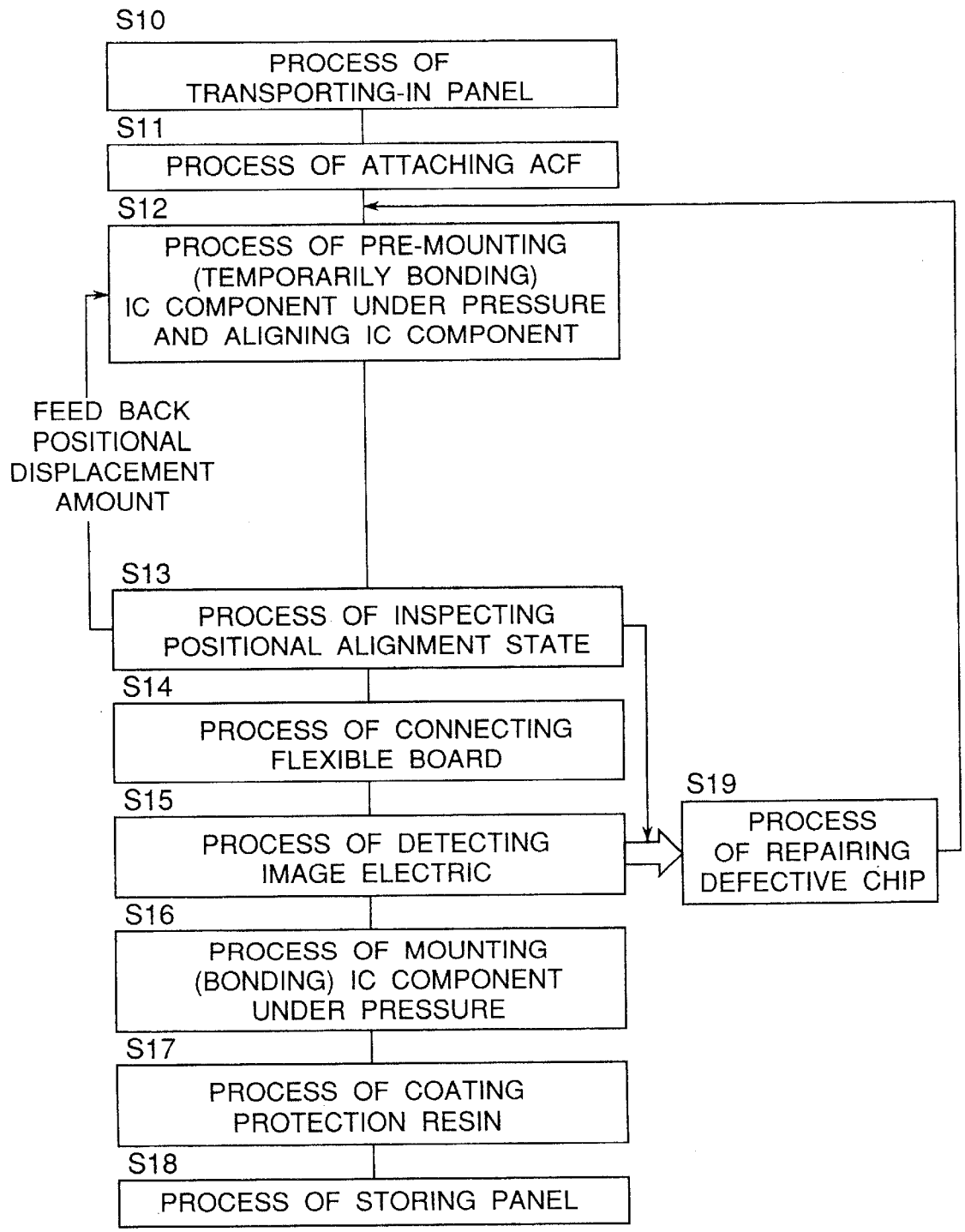
FIG. 12 is a flowchart of a bonding operation in the apparatus shown in FIG. 10.
Figure 14:
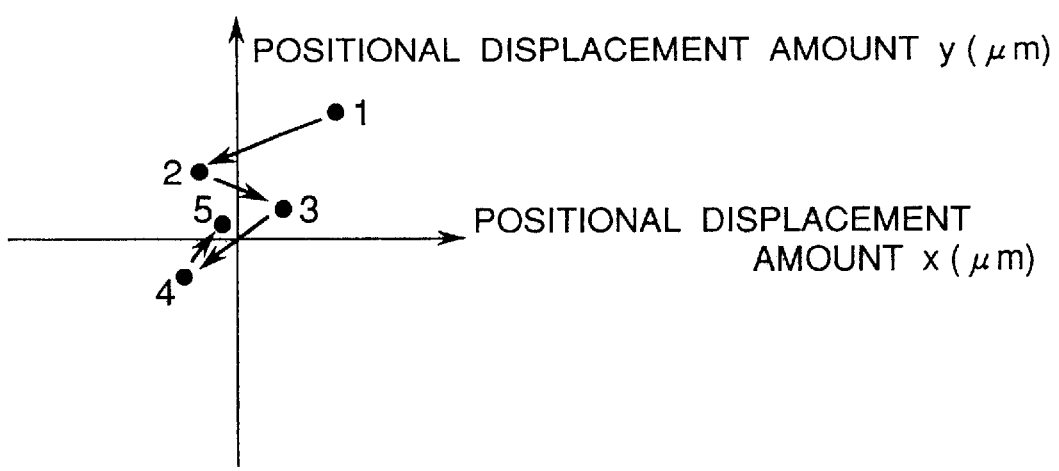
FIG. 14 is an explanatory view of a feedback operation of a positional alignment state inspection process shown in FIG. 12.
Figure 15A:
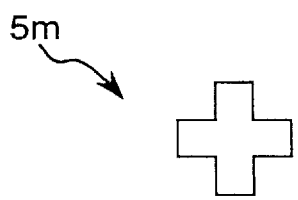
FIGS. 15A, 15B, and 15C are explanatory views of a positional alignment portion of an IC component, a positional alignment portion of a flat panel display, and a state in which both the positional alignment portions overlap each other, respectively.
Figure 15B:
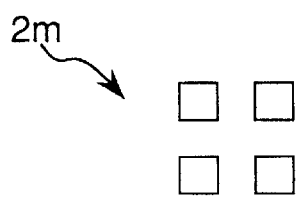
Figure 15C:
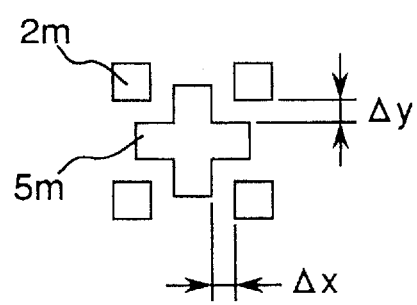
Figure 16:
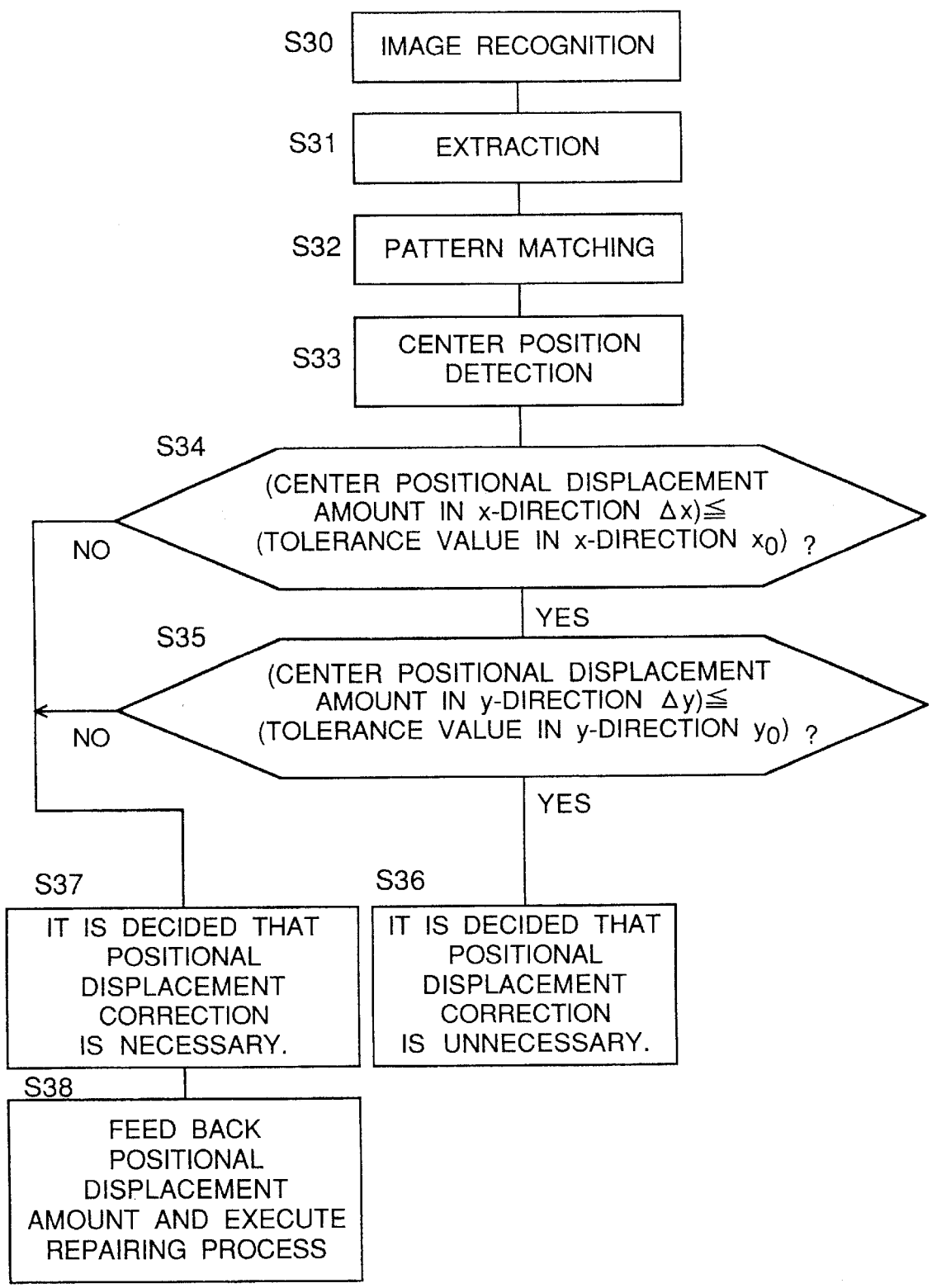
FIG. 16 is a flowchart of the positional alignment state inspection operation.

FIG. 11 is a block diagram of the positional alignment state inspecting device 100, while FIG. 12 shows a flowchart of the bonding operation. FIGS. 13A through 13D are explanatory views of states of the bonding. FIG. 14 is an explanatory view of a feedback operation of a positional alignment state inspection process. FIGS. 15A through 15C are plan views showing positional alignment portions of an IC component 5 and a flat panel display 2 and a state in which both the positional alignment portions overlap each other. FIG. 16 is a flowchart of the positional alignment state inspecting operation.

Referring to FIG. 12, a flat panel display 2 such as an LCD is placed in a specified mounting position by means of the panel transporting device 81 in step S10.

In step S11, an anisotropic conductive adhesive (ACF) 20 is attached to the electrodes 2a of the flat panel display 2 by means of the ACF attaching device 82. For example, as shown in FIG. 13A, the anisotropic conductive adhesive 20 is formed on a 70-$\mu$m thick separator 20s, and is able to be implemented by a material obtained by dispersing conductive particles 20a each having a diameter of 5$\mu$m in a 20-$\mu$m thick epoxy resin layer 20e. The anisotropic conductive adhesive 20 including the epoxy resin layer 20e and the conductive particles 20a is peeled off from the separator 20s and attached to the flat panel display 2. The conductive particles 20a are formed by plating plastic particles with Au—Ni. For example, each electrode 2a of the flat panel display 2 such as an LCD is formed of ITO, Al, or the like and has a height of 0.5 $\mu$m or less. On the other hand, each bump 5a of the IC component 5 such as an LSI is formed of Au or the like.

Subsequently, in step S12, the IC component 5 whose bumps 5a are heated is temporarily bonded to the electrodes 2a of the flat panel display 2 via the anisotropic conductive adhesive 20 by the IC mounting device 83 (refer to FIGS. 13B and 13C). In the present case, with regard to operation conditions, the IC component 5 is temporarily bonded to the flat panel display 2 via the anisotropic conductive adhesive 20 by effecting a pressurizing force of 10kgf for three seconds with the bumps 5a of the IC component 5 heated to a temperature of 130° C. In this process, the temporary bonding is performed by aligning in position the IC component 5 with the flat panel display 2 by the IC mounting device 83 while interposing the anisotropic conductive adhesive 20 between the bumps 5a of the IC component 5 and the electrodes 2a of the flat panel display 2 to which the bumps 5a are to be bonded. In this temporary bonding process, it is estimated that the bumps 5a of the IC component 5 are slightly displaced from the electrodes 2a of the flat panel display 2 due to the viscosity of the anisotropic conductive adhesive 20 when pressurizing the IC component 5 against the flat panel display 2. The amount of displacement is set as an offset value, and the temporary bonding process is performed by preliminarily displacing the IC component 5 relative to the flat panel display 2 by the offset value so that the bumps 5a of the IC component 5 will be aligned in position with the electrodes 2a of the flat panel display 2. In the state of temporary bonding, as shown in FIG. 13C, the bumps 5a of the IC component 5 and the electrodes 2a of the flat panel display 2 are designed to be electrically connected with each other via the conductive particles 20a in the anisotropic conductive adhesive 20.

Then, in step S13, the positional alignment of the IC component 5 with the flat panel display 2 is inspected by the camera 23 and the positional alignment state inspecting device 84. If the amount of positional displacement of the IC component 5 with respect to the flat panel display 2 is greater than a tolerance range, the aforementioned offset value to be used in the positional alignment process in step S12 is corrected to allow the positional alignment in the temporary bonding process for the next IC component 5 to be achieved with higher accuracy, and the program flow proceeds to step S19 to remove each IC component 5 having a great amount of positional displacement from the flat panel display 2. Then, the program flow returns to step S12 to perform the temporary bonding operation of the IC component 5.

When the positional displacement amount in step S13 is within the tolerance range, the program flow proceeds to step S14. In step S14, a flexible printed circuit (FPC) board for signal input/output use is connected to the flat panel display 2 by the flexible board connecting device 86.

Then, in step S15, the IC component 5 is inspected by supplying a power to the flat panel display 2 by the image electric inspecting device 87 and observing the state of an image on the flat panel display 2. When it is decided that the IC component 5 is a good or acceptable one, the program flow proceeds to step S16. If the state of the image is bad and it is decided that the IC component 5 is defective, the program flow proceeds to the repairing process of step S19 to remove the temporarily bonded IC component 5 from the flat panel display 2 by the repairing device 88, and the program flow returns to step S12 to perform the temporary bonding operation of the IC component 5.

In step S16, the IC component 5 is regularly or properly bonded (mounted under pressure) to the flat panel display 2 by the IC mounting device 83 (refer to FIG. 13D) That is, the IC component mounting is performed by is pressurizing the IC component 5 against the flat panel display 2 with a temperature and a pressurizing force that are higher than those in the temporary bonding process. With regard to operating conditions in this case, for example, a pressurizing force of 20 kgf is effected for 10 seconds under heating at a temperature of 180 ° C.

Then, in step S17, a protection resin such as a resin including silicon, vinyl acetate or epoxy is coated on the bonding portions of the flat panel display 2 and the IC component 5 by the protection resin coating device 89 to protect the bumps 5a and the electrodes 2a.

Then, in step S18, the flat panel display 2 mounted with mounting of the IC component 5 completed is stored in a specified position by the panel storing device 90, thereby completing the bonding operation of the IC component 5 to the flat panel display 2.

The above are the sequence of the operation of bonding the IC component 5 to the flat panel display 2.

Next, the positional alignment state inspection process in step S13 will be described in more detail.

The positional alignment is performed as follows. When mounting the IC component 5 to the electrodes 2a provided in a transparent portion of the flat panel display 2 with interposition of the anisotropic conductive adhesive 20, in the time of mounting the IC component 5 onto the transparent portion of the flat panel display 2 for the temporary bonding to the anisotropic conductive adhesive 20, positional displacement amounts of first positional alignment portions 5m provided in at least two positions of the mounted IC component 5 relative to second positional alignment portions 2m provided in at least two positions of the transparent portion of the flat panel display 2 in correspondence with the first positional alignment portions 5m are detected by the camera 23 from the side of the flat panel display 2 opposite from the side on which the IC component 5 is mounted in a manner as shown in FIG. 7, hereby inspecting the positional alignment of the IC component 5 with the flat panel display 2. When the positional alignment state is inappropriate, the positional displacement amount of the IC component 5 relative to the flat panel display 2 is fed back, and the offset value is corrected taking the fed-back positional displacement amount into account. Then, based on the corrected offset value, the positional alignment of the bumps 5a of the IC component 5 with the electrodes 2a of the flat panel display 2 is performed.

When the IC component 5 has a rectangular surface shape, the first positional alignment portions 5m of the IC component 5 are arranged in the vicinity of a corner of the rectangular surface shape and in the vicinity of another corner located diagonally with respect to the abovementioned corner, while the second positional alignment portions 2m of the flat panel display 2 are arranged in correspondence with the first positional alignment portions 5m.

For example, the first positional alignment portion 5m has a cross-like shape as shown in FIG. 15A, while the second positional alignment portion 2m has a shape composed of four squares constituting a cross-shaped gap as shown in FIG. 15B. As shown in FIG. 15C, a gap $\Delta x$ and a gap $\Delta y$ which are provided respectively in the x-direction and the y-direction in a state in which the first positional alignment portion 5m and the second positional alignment portion 2m overlap each other as viewed from the side of the flat panel display 2 opposite from the side on which the IC component 5 is mounted are perceived as positional displacement amounts.

Practically, as shown in FIGS. 11 and 16, an image of a portion of the bumps 5a of the IC component 5 is captured by the camera 23 in step S30, and the image of only the bumps 5a is extracted by an extracting section 101 in step S31. Further, in step S32, matching of respective patterns of the first positional alignment portion 5m and the second positional alignment portion 2m with the extracted image is performed in a pattern matching section 102 to thereby search the first positional alignment portion 5m and the second positional alignment portion 2m in the extracted image.

Then, in step S33, respective center positions of the first positional alignment portion 5m and the second positional alignment portion 2m are detected by a center position detecting section 103 to obtain the x-direction positional displacement amount $\Delta x$ and the y-direction positional displacement amount $\Delta y$. In step S34, it is decided whether or not the x-direction positional displacement amount $\Delta x$ ($\mu$m) is not greater than a tolerance value $x_o$ ($\mu$m) by a positional displacement amount deciding section 104.

If the positional displacement amount $\Delta x$ is not greater than the tolerance value $x_o$ in step S34, it is decided in step S35 whether or not the y-direction positional displacement amount $\Delta y$ ($\mu$m) is not greater than a tolerance value $y_o$ ($\mu$m) by the positional displacement amount deciding section 104. If the positional displacement amount $\Delta x$ exceeds the tolerance value $x_o$ in step S34, it is decided in step S37 that an x-direction positional displacement correction is required, and the offset value is corrected in step S38 by feeding back the positional displacement amount $\Delta x$ to the positional alignment mechanism of the IC mounting device 83 by an output section 105. Otherwise, when the positional displacement amount $\Delta x$ is not greater than the tolerance value $x_o$ in step S35, it is decided in step S36 that no positional displacement correction is required in both the x-direction and the y-direction, and the positional alignment state inspection process is completed. If the positional displacement amount $\Delta y$ exceeds the tolerance value $y_o$ in step S35, it is decided in step S37 that a y-direction positional displacement correction is required, and the offset value is corrected in step S38 by feeding back the positional displacement amount $\Delta y$ to the positional alignment mechanism of the IC mounting device 83 by the output section 105.

By thus correcting the offset value, as indicated by dots denoted by reference numerals 1 through 5 in FIG. 14, the offset value will gradually converge into a certain range around the origin of the x- and y-axes. Therefore, by utilizing the positional alignment information of the temporarily bonded IC component 5 for the subsequent temporary bonding process of IC components 5, the positional alignment accuracy of the IC component 5 relative to the flat panel display 2 can be improved. This arrangement eliminates the possible wastefulness due to the trial use of actual IC components only for the purpose of obtaining the offset value and obviates the need of a special process for obtaining the offset value.

The positional alignment state inspection process in the step S13 is performed just after the positional alignment process of step S12. Therefore, by incorporating the positional alignment state inspecting device 84 into the IC component positional alignment mechanism of the IC component mounting device 83, both the processes can be efficiently performed continuously. However, the positional alignment state inspection process is not limited to this, and the process can be performed after step S12. By performing the positional alignment state inspection before step S16, since each IC component S is temporarily bonded, any defective IC component 5 can be more easily dismounted from the flat panel display 2 with a tool with room temperature.

Next, a parallelism inspecting operation of the IC component 5 relative to the flat panel display 2 in the third embodiment will be described in detail.

Figure 17:
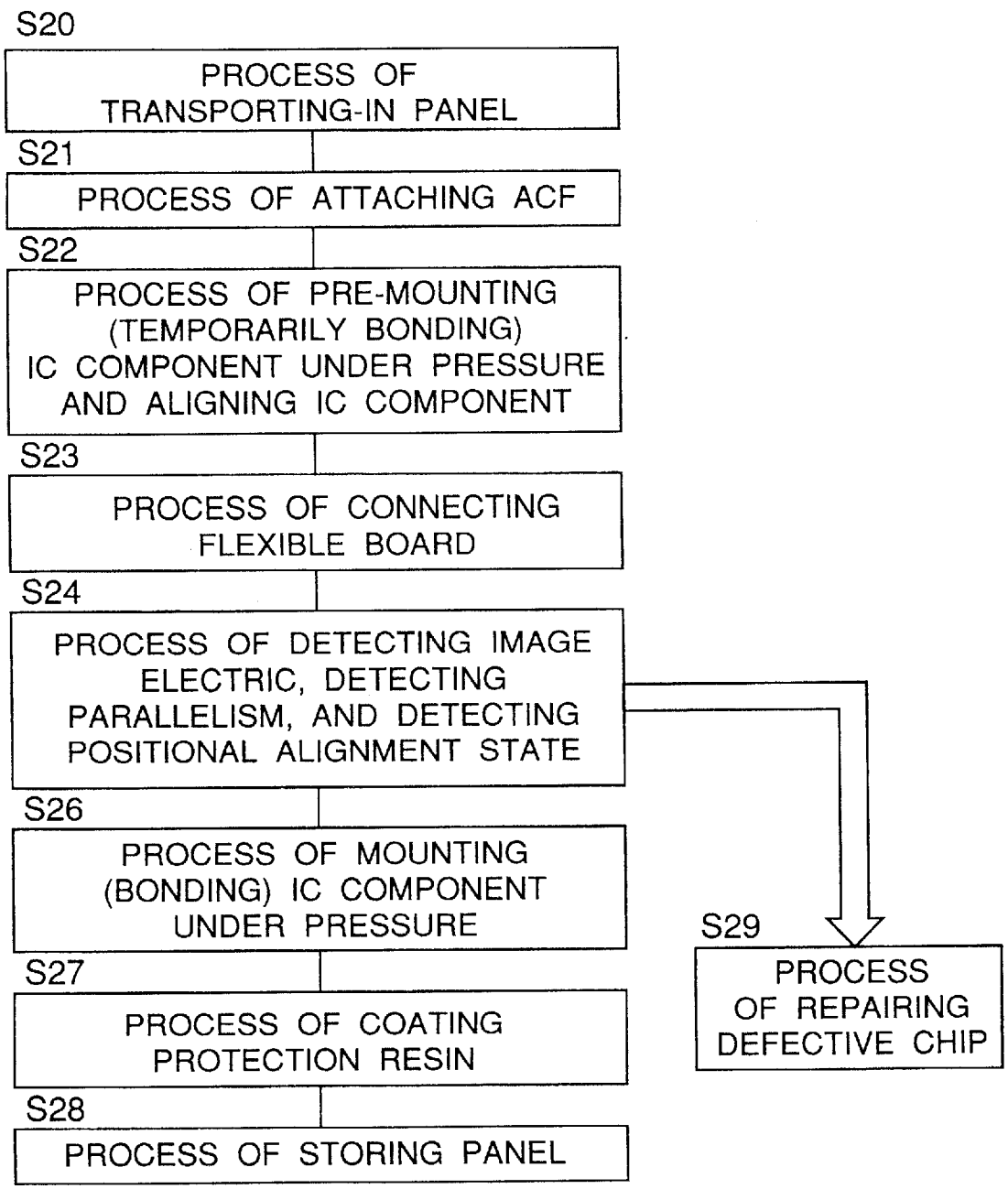
FIG. 17 is a flowchart of a bonding operation when a parallelism inspection process is performed simultaneously with the positional alignment state inspection process.

FIG. 17 shows a flowchart of a bonding operation when the parallelism inspection process is performed simultaneously with the aforementioned positional alignment state inspection process.

Since steps S20, S21, S22, S23, S26, S27, S28, and S29 shown in FIG. 17 are the same as the steps S10, S11, S12, S14, S16, S17, S18, and S19 shown in FIG. 12, no description will be provided therefor. Furthermore, the positional alignment state inspection process and the image electric inspection process in step S24 shown in FIG. 17 are the same as the positional alignment state inspection process in the step S13 and the image electric inspection process in the step S15 shown in FIG. 12, and therefore, no description will be provided therefor, and only the parallelism inspection process different from that of FIG. 12 will be described below. The parallelism inspection process is not limited to the one performed in the same process as the positional alignment state inspection process and the image electric inspection process. It is acceptable to perform the three processes in separate steps, or combine any two of the processes and perform the other process separately. Furthermore, in the bonding operation shown in FIG. 12, the parallelism inspection process can be performed instead of the positional alignment state inspection process.

The parallelism inspection process is performed in mounting the IC component 5 onto the transparent portion of the flat panel display 2 by capturing an image of the bumps 5a of the mounted IC component 5 by the camera 23 from the side of the flat panel display 2 opposite from the side on which the IC component S is mounted, detecting the state of bonding of the bumps 5a of the IC component 5 to the electrodes 2a of the flat panel display 2 in a plurality of portions, and when the state of bonding is inappropriate, outputting a warning signal on the decision that the parallelism of the IC component 5 relative to the flat panel display 2 exceeds a tolerance range.

Practically, a plurality of portions of the bumps 5a of the IC component 5 are inspected from the side of the flat panel display 2 opposite from the side on which the IC component 5 is mounted. Depending on whether or not the state of collapse of the conductive particles 20a in the anisotropic conductive adhesive 20 is within a tolerance range, or whether or not a reflectance of the bumps 5a of the IC component 5 or a difference between inspected portions thereof at each of which the intensity of a luminance signal of a specified color is inspected is within a tolerance range, it is decided whether or not the parallelism is within the tolerance range.

First, a parallelism inspection method to be executed by expressing the state of bonding of the bumps 5a of the IC component 5 to the electrodes 2a of the flat panel display 2 by the state of collapse of the conductive particles 20a interposed between the bumps 5a of the IC component 5 and the electrodes 2a of the flat panel display 2, and inspecting the state of collapse of the conductive particles 20a will be described in detail.

Figure 18:
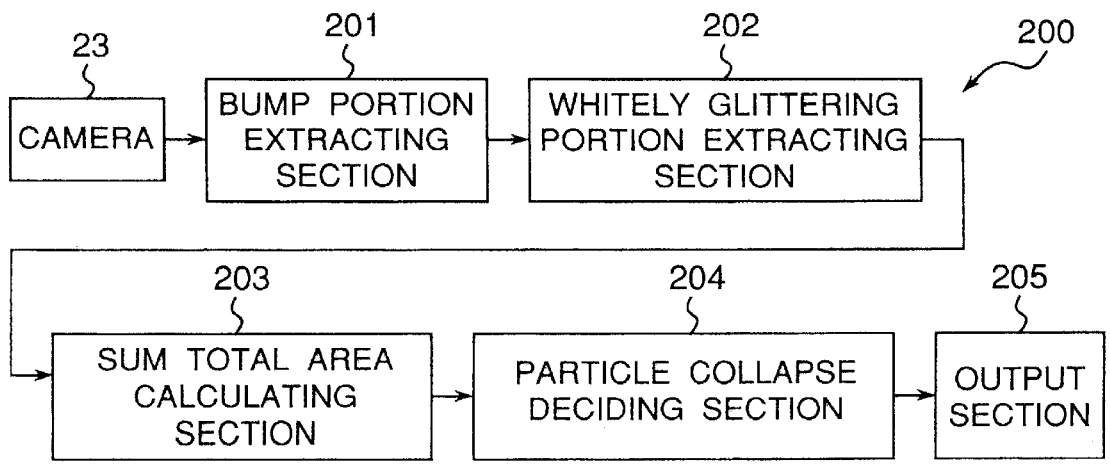
FIG. 18 is a block diagram of an inspecting apparatus for performing a process of inspecting the collapse of conductive particles.
Figure 19:
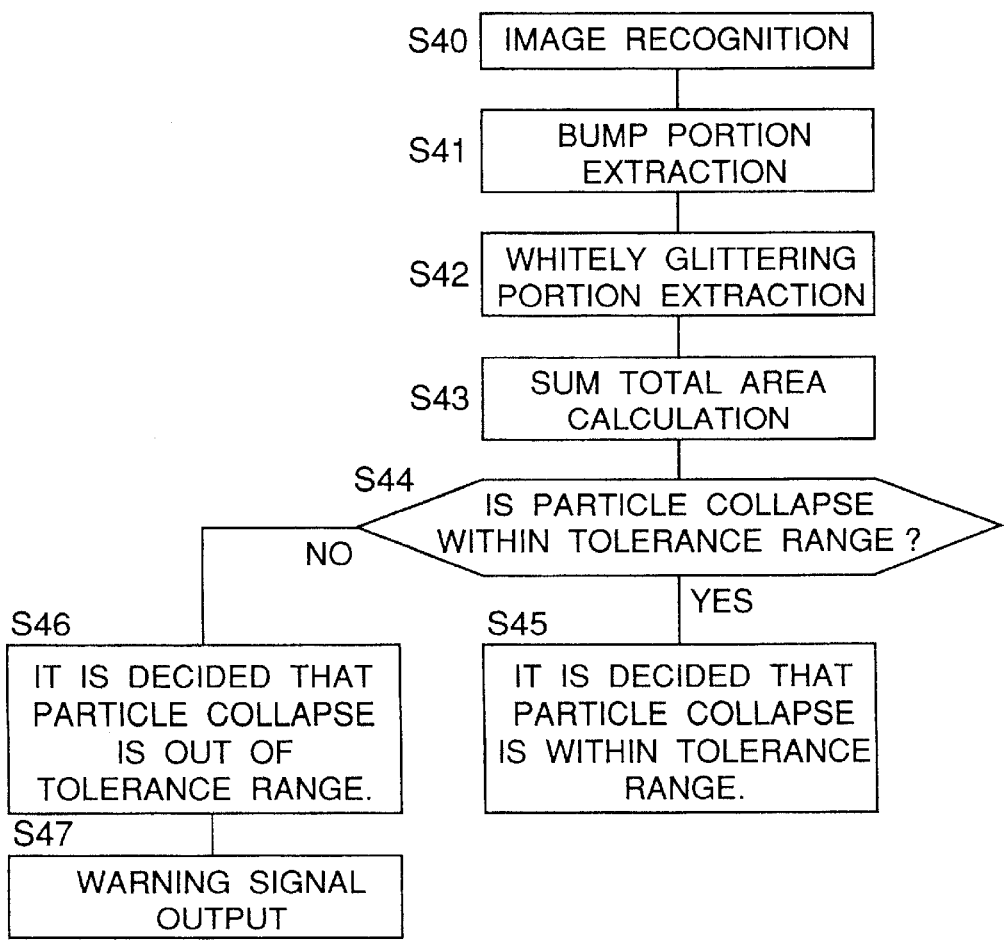
FIG. 19 is a flowchart of the process of inspecting the collapse of the conductive particles shown in FIG. 18.
Figure 20A:
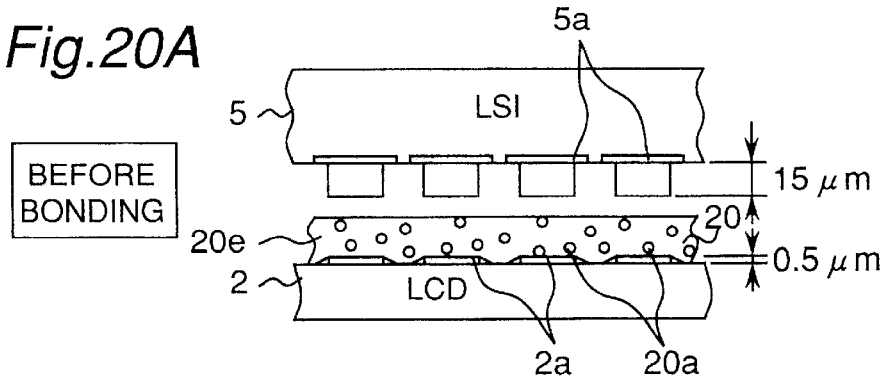
FIGS. 20A, 20B, and 20C are explanatory views of the bonding operation including the process of inspecting the collapse of the conductive particles.
Figure 20B:
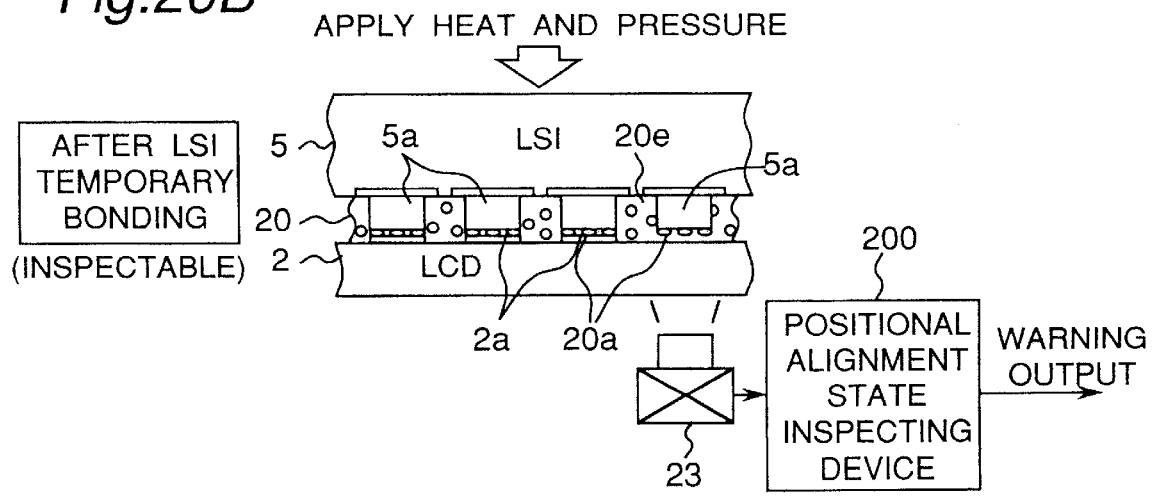
Figure 20C:
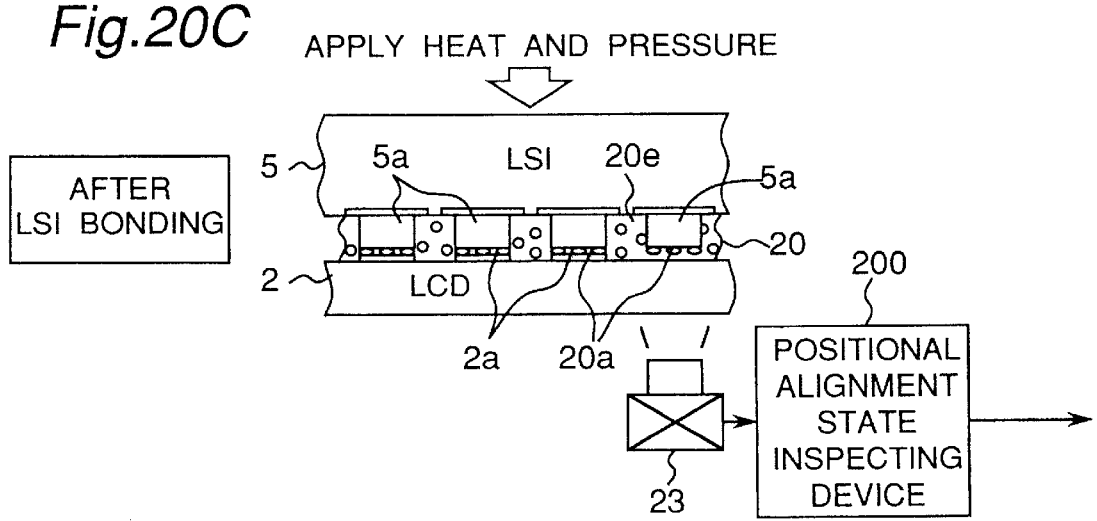

FIGS. 18 and 19 show a block diagram of the parallelism inspecting device 200 for inspecting the state of collapse of the conductive particles and a flowchart of the process, respectively. FIGS. 20A through 20C are explanatory views of the bonding operation, while FIGS. 21A and 21B are explanatory views of the inspection process of the state of collapse of the conductive particles.

Referring to FIGS. 18 and 19, an image of the bonding portion of the bumps 5a of the IC component 5 and the electrodes 2a of the flat panel display 2 is captured by the camera 23 in step S40. In the present case, with regard to the portion at which the state of bonding of the IC component 5 to the flat panel display 2 is detected, the image is captured by providing a camera 23 in each of positions in the vicinity of both lengthwise end portions of the IC component 5, or the image is captured by moving one camera 23 to each of the positions. Then, in step S41, from the respective images captured by a bump portion extracting section 201, the bump portions of the IC component 5 which includes the bumps 5a of the IC component 5 and the vicinity of the bumps 5a are extracted through pattern matching or the like. Then, in step S42, an area having a luminance higher than a predetermined threshold value is extracted out of the extracted bump portions by an extracting section 202 for extracting a whitely glittering portion. When the conductive particles 20a are plated with Au or the like, the conductive particles 20a having a higher luminance glitter whitely in comparison with the portions other than the conductive particles. Therefore, extracting the area of the portions having a higher luminance means extraction of the portions of the conductive particles 20a. In step S43, the sum total of the extracted areas is obtained at each portion by a sum total area calculating section 203. In step S44, when a particle collapse deciding section 204 decides that each value of the sum total of the areas is greater than a specified value, it is decided in step S45 that the state of collapse of the conductive particles 20a is permissible. Otherwise, when each value of the sum total of the areas is not greater than the specified value, it is decided in step S46 that the state of collapse of the conductive particles 20a is not permissible, i.e., it is decided that the parallelism of the IC component 5 with respect to the flat panel display 2 is out of the tolerance range. Therefore, in step S47, a warning signal is outputted by an output section 205.

Figure 21A:
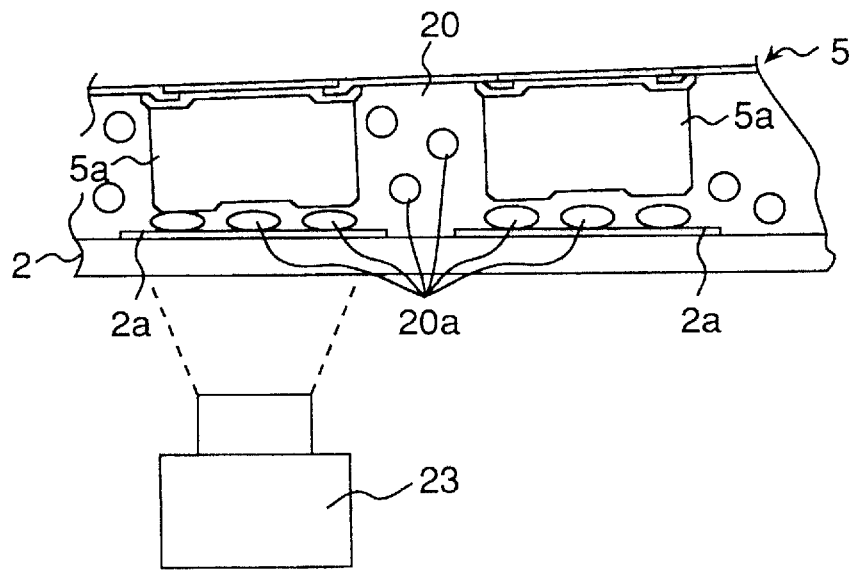
FIGS. 21A and 21B are explanatory views showing a state in which the collapse of the conductive particles is inspected.
Figure 21B:
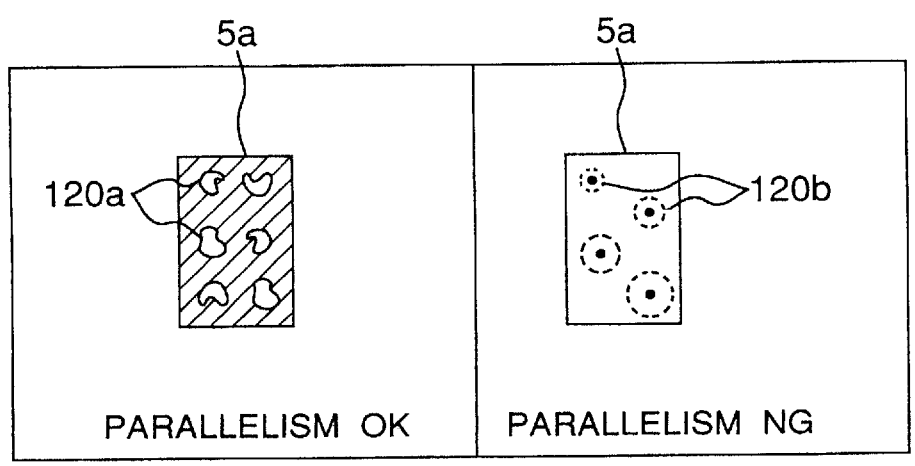

More concretely, FIG. 21A shows a state in which the IC component 5 is inclined with its left-hand bump 5a put closer to the flat panel display 2 than its right-hand bump 5a. FIG. 21B schematically shows a state in which images of the above state are captured by the camera 23 and processed by the bump portion extracting section 201 and the whitely glittering portion extracting section 202. The conductive particles 20a placed between the left-hand bump 5a and an electrode 2a exhibit their images 120a that are not circular but collapsed, whereas the conductive particles 20a placed between the right-hand bump 5a and an electrode 2a exhibit small circles (luminescent spots) 120b, and this indicates that the conductive particles 20a are scarcely collapsed and are put in point contact with the electrode 2a. In such a state, the bump 5a and the electrode 2a are not satisfactorily connected electrically with each other, thereby causing an increased electric resistance, for which the image electric inspection process of the flat panel display 2 cannot be performed. Therefore, according to the inspection of the parallelism, the parallelism of the left-hand bump 5a is permissible, however, the right-hand bump 5a is not permissible.

A concrete example of the above case is as follows. The anisotropic conductive adhesive 20 is implemented by a material which includes a 20-$\mu$m thick epoxy resin layer 20e and conductive particles 20a each having a diameter of 5 $\mu$m dispersed in the epoxy resin layer 20e. The conductive particles 20a are formed by plating plastic particles with Au—Ni or Ni particles. The electrodes 2a of the flat panel display 2 are formed of ITO, Al or the like and have a height of 0.5 $\mu$m or less. On the other hand, the bumps 5a of the IC component 5 such as an LSI are formed of Au or the like and have a height of about 15 $\mu$m. In the present example, it is required to assure a parallelism of not greater than 2 $\mu$m between the surface of the electrode 2a and a surface portion of the bumps 5a located farthest apart from the electrode 2a.

Next, a parallelism inspection process to be executed by expressing the state of bonding of the bumps 5a of the IC component 5 to the electrodes 2a of the flat panel display 2 by the reflectance of the bump portions of the IC component 5, and inspecting the reflectance will be described in detail.

Figure 22:
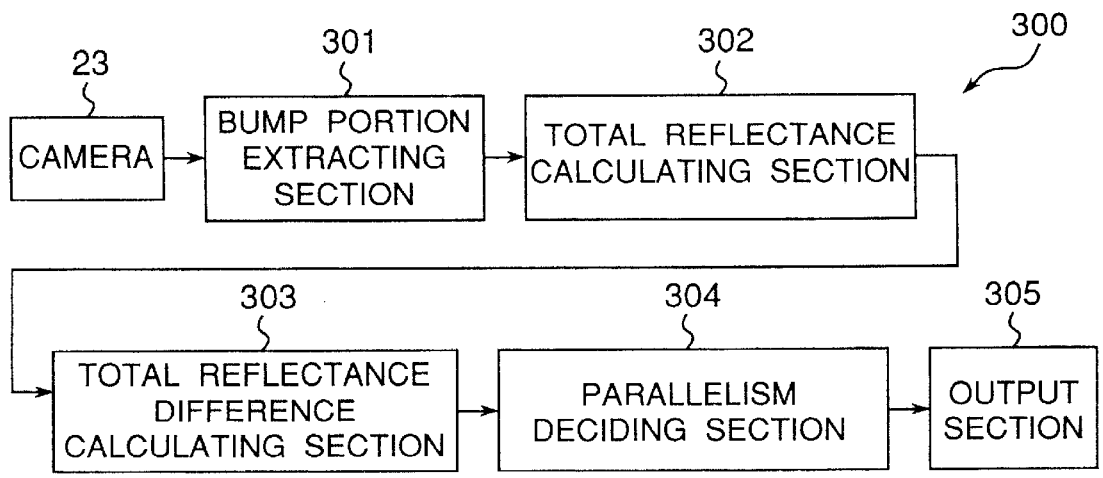
FIG. 22 is a block diagram of a parallelism inspecting apparatus for inspecting the reflectance of bump portions.
Figure 23:
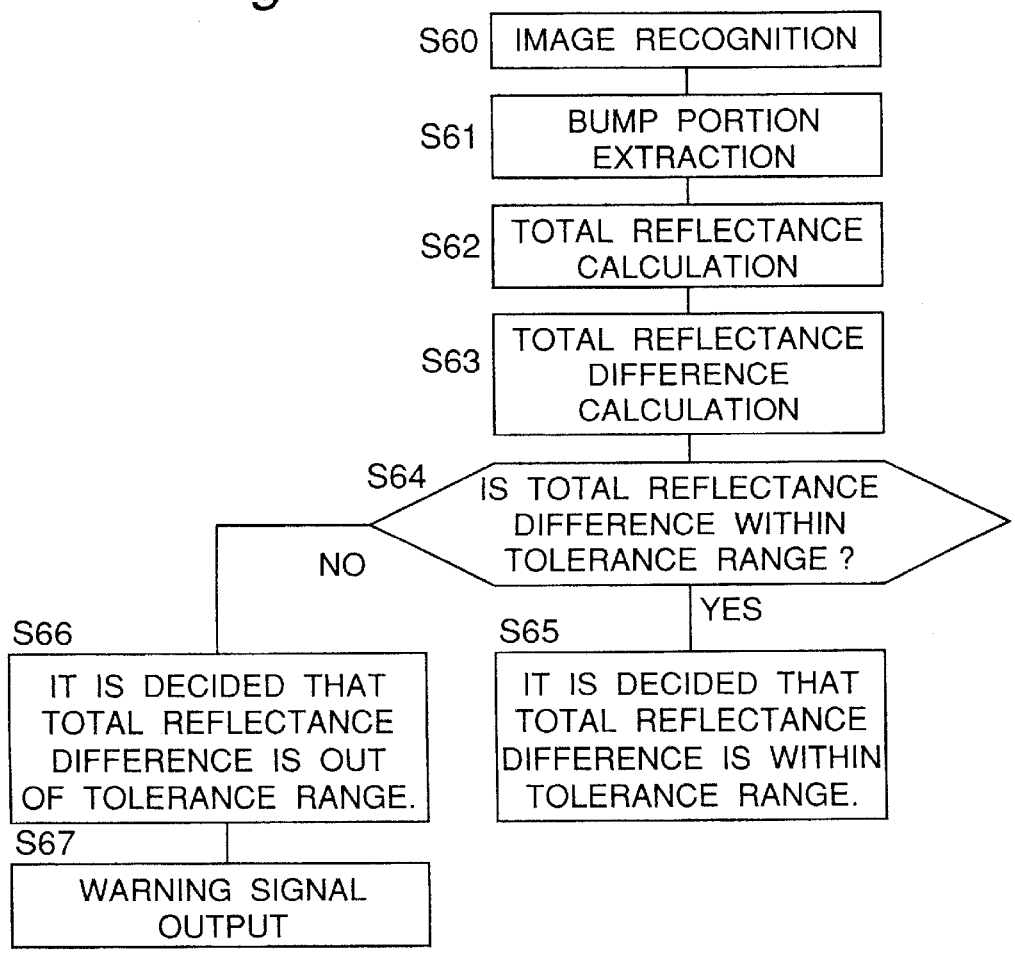
FIG. 23 is a flowchart of a process of inspecting the reflectance of the bump portions.

FIGS. 22 and 23 show a block diagram of the parallelism inspecting device 300 for inspecting the reflectance and a flowchart of the reflectance inspection process, respectively. FIGS. 24A through 24F are explanatory views of the aforementioned bonding operation.

Referring to FIGS. 22 and 23, an image of the bonding portion of the bumps 5a of the IC component 5 to the electrodes 2a of the flat panel display 2 is captured by the camera 23 in step S60. In step S61, a plurality of bump portions of the IC component 5 are extracted from the image captured by a bump portion extracting section 301. In step S62, a total reflectance is obtained at each of the plurality of extracted bump portions by a total reflectance calculating section 302. In step S63, a difference between the obtained total reflectance values is obtained by a total reflectance difference calculating section 303. In step S64, when a parallelism deciding section 304 decides that the difference is greater than a specified value, it is decided in step S66 that the parallelism of the IC component 5 relative to the flat panel display 2 is out of the tolerance range, and a warning signal is outputted by an output section 305 in step S67. Otherwise, when the difference is not greater than the specified value in step S64, it is decided that the parallelism of the IC component 5 relative to the flat panel display 2 is within the tolerance range, and the sequential process is performed in the bonding operation.

Figure 24A:
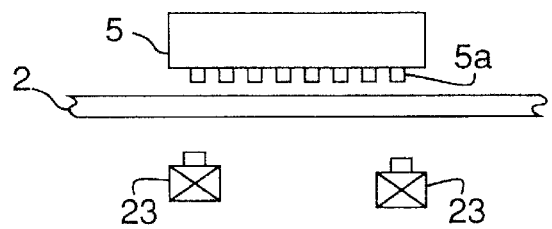
FIG. 24A is a side view showing a state of reflectance inspection.
Figure 24B:
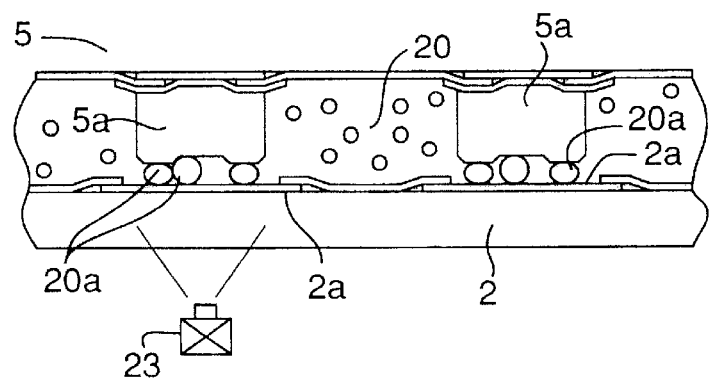
FIG. 24B is an enlarged view of a part of the above state.
Figure 24C:
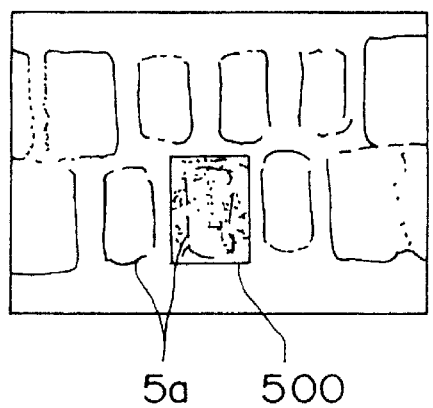
FIGS. 24C, 24D, 24E, and 24F are explanatory views schematically showing states of reflectance inspection.
Figure 24D:
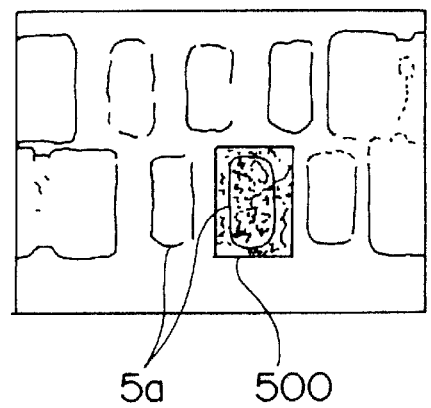
Figure 24E:
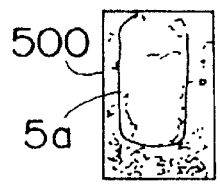
Figure 24F:
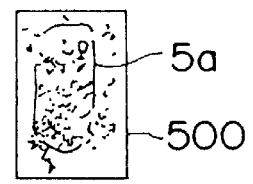

FIG. 24A shows a case where the bumps 5a at both lengthwise end portions of the IC component 5 are inspected by the camera 23. FIG. 24B shows a state in which two bumps 5a are both connected to the electrodes 2a via the conductive particles 20a in a satisfactory state of conduction. FIGS. 24C through 24F schematically show examples in which the bump portions are extracted in the above state. FIGS. 24C and 24D illustrate detailed states of the conductive particles 20a and so forth only within extraction areas 500, and the other portions are illustrated only of their shapes with the conductive particles 20a and so forth thereof not shown. FIGS. 24E and 24F show only the states within the extraction areas 500. In FIGS. 24C and 24D, the difference of total reflectance values is within a tolerance range and the parallelism is within a tolerance range. In contrast to this, in FIGS. 24E and 24F, the difference of total reflectance values is out of the tolerance range and the parallelism is out of the tolerance range.

Next, a parallelism inspection process to be executed by expressing the state of bonding of the bumps 5a of the IC component 5 to the electrodes 2a of the flat panel display 2 by an intensity difference between luminance signals of a specified color of the bump portions of the IC component, and inspecting the intensity difference will be described in detail.

Figure 25:
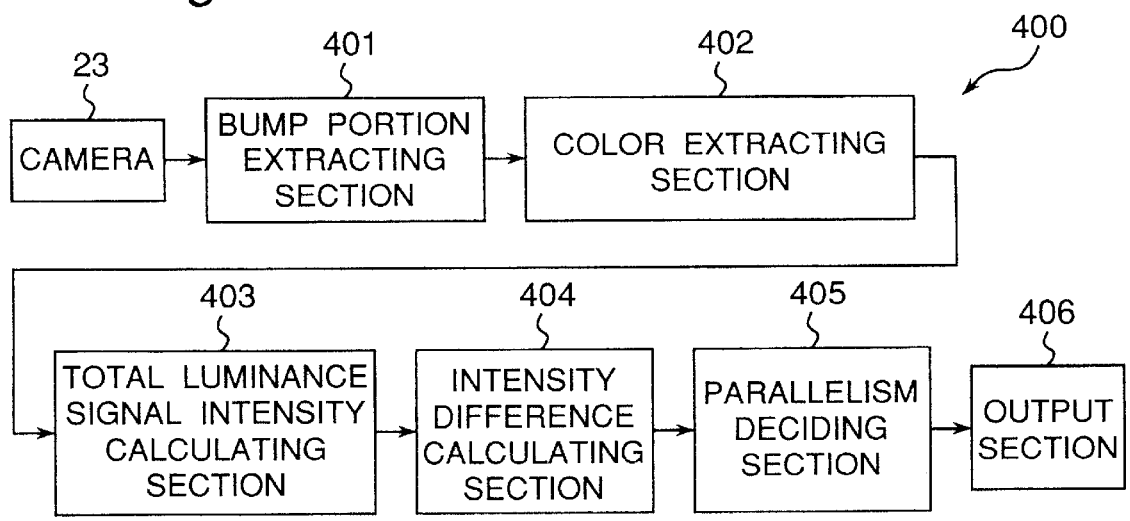
FIG. 25 is a block diagram of a parallelism inspecting apparatus for performing a process of inspecting an intensity difference between luminance signals in the third embodiment.
Figure 26:
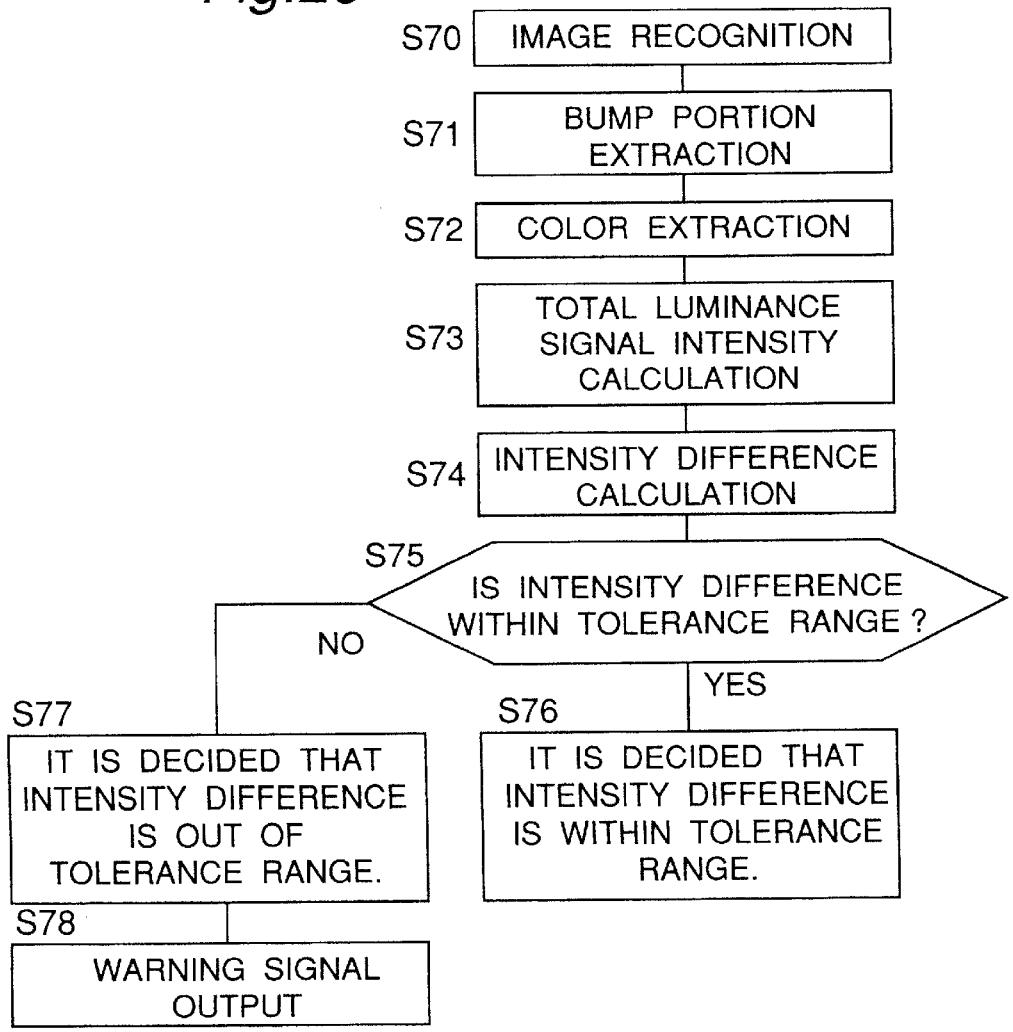
FIG. 26 is a flowchart of the inspection process shown in FIG. 25.
Figure 28:
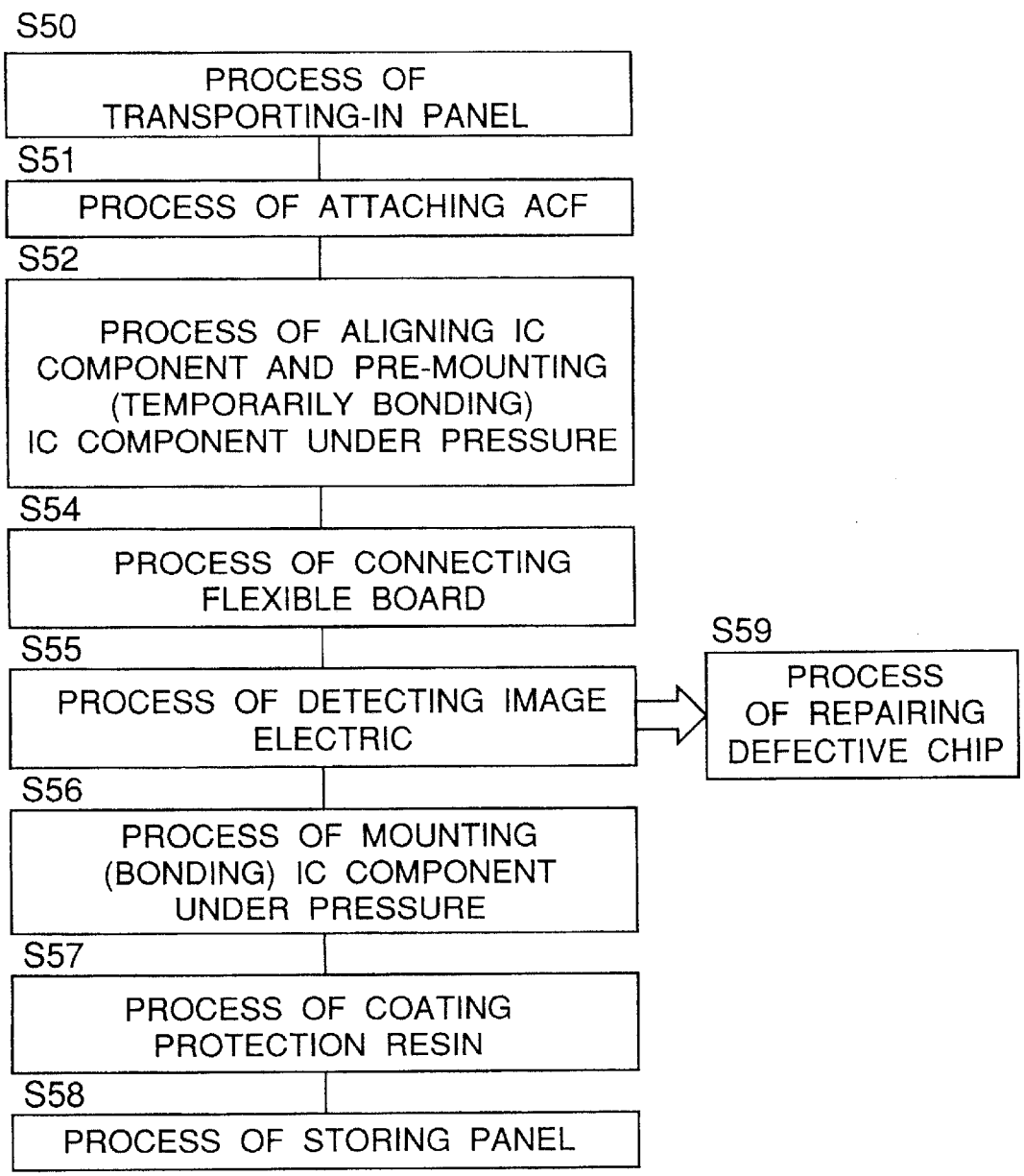
FIG. 28 is a flowchart of the prior art bonding operation shown in FIG. 27.

FIGS. 25 and 26 show a block diagram of the parallelism inspecting device 400 for performing the intensity difference inspection process and a flowchart of the process, respectively.

Referring to FIGS. 25 and 26, an image of the bonding portion of the bumps 5a of the IC component 5 and the electrodes 2a of the flat panel display 2 is captured by the camera 23 in step S70. In step S71, the plurality of bump portions of the IC component 5 are extracted from the captured image by a bump portion extracting section 401 through pattern matching or the like. In step S72, extraction of a specified identical color is performed in the plurality of extracted bump portions by a color extracting section 402. For example, when the conductive particles are plated with Au, yellowish or golden glittering portions are extracted. In step S73, a sum total in intensity of the luminance signals of the color at each extracted bump portion is obtained by a total luminance signal intensity calculating section 403. In step S74, a difference between the sum totals in intensity of the luminance signals at the extracted bump portions is obtained by an intensity difference calculating section 404.

In step S75, when a parallelism deciding section 405 decides that the difference between the sum totals in intensity of the luminance signals is greater than a specified value, it is decided in step S77 that the parallelism of the IC component 5 relative to the flat panel display 2 is out of the tolerance range, and a warning signal is outputted by an output section 406 in step S78. When the difference between the sum totals in intensity of the luminance signals is not greater than the specified value in step S75, it is decided in step S77 that the parallelism of the IC component 5 relative to the flat panel display 2 is within the tolerance range, and the sequential process is performed in the bonding operation.

The specified value used for deciding whether or not the difference between the sum totals in intensity of the luminance signals is greater than the specified value is preferably obtained by preparing a sample of a permissible state of bonding and a sample of an impermissible state of bonding and determining the tolerance range of the difference between the sum totals in intensity of the luminance signals from these samples.

With regard to the portions to inspect the state of bonding of the IC component 5 to the flat panel display 2 in the bonding state inspection processes such as the inspection of the state of collapse of the conductive particles, the inspection of reflectance, and the inspection of the intensity difference between the luminance signals, by performing each inspection in first bonding state detecting portions located in the vicinity of both the lengthwise end portions of the IC component 5, the parallelism of the IC component 5 in the lengthwise direction can be inspected. Furthermore, in addition to this, by performing each inspection in second bonding state detecting portions located in the vicinity of both end portions in the widthwise direction perpendicular to the lengthwise direction, the parallelism at the fore portion of the IC component 5 in the widthwise direction as well as the parallelism at the hind portion of the IC component 5 in the widthwise direction can be inspected in addition to the parallelism in the lengthwise direction of the IC component 5, thereby allowing the inspection of parallelism to be achieved with higher accuracy.

The parallelism inspection process of the step S24 shown in FIG. 17 is performed in the same process as the positional alignment state inspection process and the image electric inspection process. Therefore, by incorporating the positional alignment inspecting device 84, the parallelism inspecting device 85, and the image electric inspecting device 87 into the positional alignment mechanism of the IC component mounting device 83, these processes can be efficiently performed continuously. However, the parallelism inspection process is not limited to this, and the process can be performed in an arbitrary stage subsequent to the step S22 and prior to the step S26. When the parallelism inspection process is performed prior to the step S26, the IC component 5 is temporarily bonded. Therefore, any defective IC component 5 can be more easily dismounted from the flat panel display 2 without substantially damaging the anisotropic conductive adhesive 20. If the parallelism inspection process is performed in the step S26 or a subsequent step, it is possible that the is anisotropic conductive adhesive 20 will be seriously damaged when dismounting the defective IC component 5 from the flat panel display 2. In such a case, it is required to attach again the anisotropic conductive adhesive 20, causing a trouble.

It is to be noted that the present invention is not limited to any of the aforementioned embodiments, and is able to be implemented in a variety of embodiment forms. For example, each positional alignment portion may have any arbitrary shape so long as it allows the same positional alignment inspection to be achieved. Furthermore, the aforementioned warning signal can be utilized in a variety of forms for such purposes as informing the operator of the warning by flashing a warning lamp or the like or performing a specified control operation by being inputted to another relevant apparatus.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting an IC component to a flat panel display, wherein an IC component is mounted to electrodes provided in a transparent portion of a flat panel display with interposition of an anisotropic conductive adhesive or film, the method comprising steps of:

detecting, when mounting the IC component onto the transparent portion of the flat panel display for temporary bonding to the anisotropic conductive adhesive or film, positional displacement amounts of first positional alignment portions provided in at least two positions of the mounted IC component relative to second positional alignment portions provided in at least two positions of the transparent portion of the flat panel display in correspondence with the first positional alignment portions by a camera from a side of the flat panel display opposite from a side on which the IC component is mounted, thereby inspecting positional alignment state of bumps of the IC component with the electrodes of the flat panel display;

feeding back the positional displacement amount of the IC component with respect to the flat panel display when the positional alignment state is not acceptable; and performing positional alignment of bumps of a next IC component with the electrodes of the flat panel display while taking the fed-back positional displacement amount into account.

2. The method as claimed in claim 1, wherein the IC component has a rectangular surface shape, and the first positional alignment portions of the IC component are arranged in a vicinity of a corner of the rectangular surface shape and in a vicinity of another corner located diagonally with respect to the above-mentioned corner, while the second positional alignment portions of the flat panel display are arranged in correspondence with the first positional alignment portions.

3. The method as claimed in claim 1, further comprising steps of:

capturing an image of the bumps of the mounted IC component by the camera from the side of the flat panel display opposite from the side on which the IC component is mounted;

detecting a state of bonding of the bumps of the IC component to the electrodes of the flat panel display in a plurality of portions;

deciding that a parallelism of the IC component relative to the flat panel display exceeds a tolerance range when the state of bonding is not acceptable, and then outputting a warning signal.

4. A method of mounting an IC component to a flat panel display, wherein an IC component is mounted to electrodes provided in a transparent portion of a flat panel display with interposition of an anisotropic conductive adhesive or film including conductive particles, the method comprising steps of:

capturing, when mounting the IC component onto the transparent portion of the flat panel display for temporary bonding to the anisotropic conductive adhesive or film, an image of bumps on the electrodes of the mounted IC component by the camera from the side of the flat panel display opposite from the side on which the IC component is mounted;

detecting a state of bonding of the bumps of the IC component to the electrodes of the flat panel display in a plurality of portions;

deciding that a parallelism of the IC component relative to the flat panel display exceeds a tolerance range when the state of bonding is not acceptable, and then outputting a warning signal.

5. The method as claimed in claim 3, wherein the state of bonding is expressed by a state of collapse of conductive particles included in the anisotropic conductive adhesive or film interposed between the bumps of the IC component and the electrodes of the flat panel display.

6. The method as claimed in claim 4, wherein the state of bonding is expressed by a state of collapse of the conductive particles included in the anisotropic conductive adhesive or film interposed between the bumps of the IC component and the electrodes of the flat panel display.

7. The method as claimed in claim 5, wherein in the step of capturing the image, an image of a bonding portion of the bumps of the IC component and the electrodes of the flat panel display is captured by the camera, and in the step of detecting the state of the collapse of the conductive particles as the state of bonding, this step including steps of:

extracting from the captured image a bump portion including at least one of the bumps of the IC component and a vicinity of the bump;

extracting areas each having a luminance higher than a threshold value out of each of the extracted bump portion;

obtaining a sum total of the extracted areas; and deciding that the state of the collapse of the conductive particles is permissible when a value of the sum total of the areas is greater than a specified value, and deciding that the state of collapse of the conductive particles is not permissible when a value of the sum total of the areas is not greater than the specified value and then outputting a warning signal.

8. The method as claimed in claim 3, wherein in the step of capturing the image, an image of a bonding portion of the bumps of the IC component and the electrodes of the flat panel display is captured by the camera, and in the step of detecting the state of bonding, this step including steps of:

extracting from the captured image a plurality of bump portions including the bumps of the IC component and a vicinity of the bumps of the IC component;

obtaining a total reflectance at each of the plurality of extracted bump portions;

obtaining a difference between the obtained total reflectance values;

deciding that the parallelism of the IC component relative to the flat panel display is out of the tolerance range when the difference is greater than a specified value, and then outputting a warning signal.

9. The method as claimed in claim 4, wherein
in the step of capturing the image, an image of a bonding portion of the bumps of the IC component and the electrodes of the flat panel display is captured by the camera, and
in the step of detecting the state of bonding, this step including steps of:
extracting from the captured image a plurality of bump portions including the bumps of the IC component and a vicinity of the bumps of the IC component;
obtaining a total reflectance at each of the plurality of extracted bump portions;
obtaining a difference between the obtained total reflectance values;
deciding that the parallelism of the IC component relative to the flat panel display is out of the tolerance range when the difference is greater than a specified value, and then outputting a warning signal.

10. The method as claimed in claim 3, wherein
in the step of capturing the image, an image of a bonding portion of the bumps of the IC component and the electrodes of the flat panel display is captured by the camera, and
in the step of detecting the state of bonding, this step including steps of:
extracting from the captured image a plurality of bump portions including the bumps of the IC component and a vicinity of the bumps of the IC component;
extracting of a specified identical color in each of the plurality of extracted bump portions;
obtaining a sum total in intensity of luminance signals of the color at each of the extracted bump portions;
obtaining a difference between the sum totals in intensity of the luminance signals at the extracted bump portions;
deciding that the parallelism of the IC component relative to the flat panel display is out of the tolerance range when the difference between the sum totals in intensity of the luminance signals is greater than a specified value, and then outputting a warning signal.

11. The method as claimed in claim 4, wherein
in the step of capturing the image, an image of a bonding portion of the bumps of the IC component and the electrodes of the flat panel display is captured by the camera, and
in the step of detecting the state of bonding, this step including steps of:
extracting from the captured image a plurality of bump portions including the bumps of the IC component and a vicinity of the bumps of the IC component;
extracting of a specified identical color in each of the plurality of extracted bump portions;
obtaining a sum total in intensity of luminance signals of the color at each of the extracted bump portions;
obtaining a difference between the sum totals in intensity of the luminance signals at the extracted bump portions;
deciding that the parallelism of the IC component relative to the flat panel display is out of the tolerance range when the difference between the sum totals in intensity of the luminance signals is greater than a specified value, and then outputting a warning signal.

12. The method as claimed in claim 3, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

13. The method as claimed in claim 4, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

14. The method as claimed in claim 6, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

15. The method as claimed in claim 7, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

16. The method as claimed in claim 9, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

17. The method as claimed in claim 11, wherein portions each for inspecting the state of bonding of the IC component to the flat panel display are first bonding state detecting portions located in a vicinity of both a lengthwise end portions of the IC component, and second bonding state detecting portions located in a vicinity of both end portions in a widthwise direction perpendicular to the lengthwise direction.

* * * * *